(12) United States Patent
Fujioka et al.

(10) Patent No.: US 11,549,172 B2
(45) Date of Patent: Jan. 10, 2023

(54) COMPOUND SEMICONDUCTOR, METHOD FOR MANUFACTURING SAME, AND NITRIDE SEMICONDUCTOR

(71) Applicant: JAPAN SCIENCE AND TECHNOLOGY AGENCY, Kawaguchi (JP)

(72) Inventors: Hiroshi Fujioka, Tokyo (JP); Kohei Ueno, Tokyo (JP)

(73) Assignee: JAPAN SCIENCE AND TECHNOLOGY AGENCY, Kawaguchi (JP)

( * ) Notice: Subject to any disclaimer, the term of this patent is extended or adjusted under 35 U.S.C. 154(b) by 0 days.

(21) Appl. No.: 17/086,753

(22) Filed: Nov. 2, 2020

(65) Prior Publication Data

US 2021/0047720 A1 Feb. 18, 2021

Related U.S. Application Data

(62) Division of application No. 16/329,037, filed as application No. PCT/JP2017/020513 on Jun. 1, 2017, now Pat. No. 10,865,469.

(30) Foreign Application Priority Data

Aug. 31, 2016 (JP) .............................. JP2016-169994

(51) Int. Cl.
*C23C 14/06* (2006.01)
*C23C 14/34* (2006.01)
(Continued)

(52) U.S. Cl.
CPC .......... *C23C 14/0641* (2013.01); *C23C 14/06* (2013.01); *C23C 14/34* (2013.01);
(Continued)

(58) Field of Classification Search
CPC ..... C23C 14/0641; C23C 14/34; H01L 21/20; H01L 21/203; H01L 29/778;
(Continued)

(56) References Cited

U.S. PATENT DOCUMENTS

| 5,278,433 A | 1/1994 | Manabe et al. |
| 9,865,721 B1 | 1/2018 | Beam, III et al. |

(Continued)

FOREIGN PATENT DOCUMENTS

| CN | 101605930 A | 12/2009 |
| CN | 105917478 A | 8/2016 |

(Continued)

OTHER PUBLICATIONS

Office Action issued in Taiwanese Appln. No 106118290 dated Dec. 3, 2020. English machine translation provided.
(Continued)

*Primary Examiner* — Humera N. Sheikh
*Assistant Examiner* — Kevin Ct Li
(74) *Attorney, Agent, or Firm* — Rossi, Kimms & McDowell LLP

(57) ABSTRACT

A compound semiconductor has a high electron concentration of $5 \times 10^{19}$ cm$^{-3}$ or higher, exhibits an electron mobility of 46 cm$^2$/V·s or higher, and exhibits a low electric resistance, and thus is usable to produce a high performance semiconductor device. The present invention provides a group 13 nitride semiconductor of n-type conductivity that may be formed as a film on a substrate having a large area size at a temperature of room temperature to 700° C.

16 Claims, 15 Drawing Sheets

RELATIONSHIP BETWEEN MOBILITY AND CARRIER CONCENTRATION OF Si-DOPED n-TYPE GaN

(51) Int. Cl.

| | |
|---|---|
| H01L 21/20 | (2006.01) |
| H01L 21/203 | (2006.01) |
| H01L 29/778 | (2006.01) |
| H01L 29/786 | (2006.01) |
| H01L 29/812 | (2006.01) |
| H01L 33/32 | (2010.01) |
| H01S 5/042 | (2006.01) |
| H01S 5/183 | (2006.01) |
| H01S 5/343 | (2006.01) |

(52) U.S. Cl.
CPC ............ *H01L 21/20* (2013.01); *H01L 21/203* (2013.01); *H01L 29/778* (2013.01); *H01L 29/7788* (2013.01); *H01L 29/786* (2013.01); *H01L 29/78603* (2013.01); *H01L 29/812* (2013.01); *H01L 33/32* (2013.01); *H01L 33/325* (2013.01); *H01S 5/042* (2013.01); *H01S 5/183* (2013.01); *H01S 5/343* (2013.01); *H01S 5/04253* (2019.08); *H01S 5/04257* (2019.08)

(58) Field of Classification Search
CPC ............... H01L 29/786; H01L 29/7788; H01L 29/78603; H01L 29/812; H01L 33/32; H01L 33/325; H01S 5/042; H01S 5/045; H01S 5/183; H01S 5/343
See application file for complete search history.

(56) References Cited

U.S. PATENT DOCUMENTS

| | | |
|---|---|---|
| 2007/0228407 A1 | 10/2007 | Takeda |
| 2009/0081857 A1 | 3/2009 | Hanser |
| 2010/0320462 A1 | 12/2010 | Koukitu |
| 2011/0108796 A1 | 5/2011 | Wang |
| 2011/0174626 A1 | 7/2011 | Hamada et al. |
| 2013/0273346 A1 | 10/2013 | Mesuda et al. |
| 2015/0060876 A1 | 3/2015 | Xing et al. |
| 2015/0380496 A1 | 12/2015 | Ishibashi |
| 2016/0056327 A1 | 2/2016 | Sugiyama et al. |
| 2016/0172473 A1 | 6/2016 | Suzuki et al. |
| 2016/0225913 A1 | 8/2016 | Fujioka |
| 2017/0012166 A1 | 1/2017 | Miyoshi |

FOREIGN PATENT DOCUMENTS

| | | | |
|---|---|---|---|
| JP | H03252175 A | | 11/1991 |
| JP | 2003273398 A | | 9/2003 |
| JP | 2006013473 A | | 1/2006 |
| JP | 2007243006 A | | 9/2007 |
| JP | 2007250727 A | | 9/2007 |
| JP | 2008053426 A | | 3/2008 |
| JP | 2008243873 A | | 10/2008 |
| JP | 2009138235 A | | 6/2009 |
| JP | 2010056435 A | | 3/2010 |
| JP | 2010070430 A | | 4/2010 |
| JP | 2010537408 A | | 12/2010 |
| JP | 2011101000 A | | 5/2011 |
| JP | 2011230955 A | | 11/2011 |
| JP | 2013079187 A | | 5/2013 |
| JP | 2013079187 A | * | 5/2013 |
| JP | 2014159368 A | | 9/2014 |
| JP | 2014199850 A | | 10/2014 |
| JP | 2015149342 A | | 8/2015 |
| JP | 2016115931 A | | 6/2016 |
| JP | 2016121064 A | | 7/2016 |
| WO | 2008096884 A1 | | 8/2008 |
| WO | 2009023722 A1 | | 2/2009 |
| WO | 2011021248 A1 | | 2/2011 |
| WO | 2011067893 A1 | | 6/2011 |
| WO | 2015029435 A1 | | 3/2015 |
| WO | 2015119066 A1 | | 8/2015 |

OTHER PUBLICATIONS

Office Action issued in Indian Appln. No. 201917011158 dated Jun. 23, 2021. English translation provided.
Office Action issued in Japanese Appln. No. 2018-196890 dated Jul. 6, 2021. English machine translation provided.
Office Action issued in Indian Patent Appln. No. 201917052907 dated Mar. 9, 2022.
Office Action issued in Japanese Appln. No. 2018-196889 dated Mar. 23, 2021. English machine translation provided.
Zhao et al. "Optical Absorption and Photoluminescence Studies of n-Type GaN." Jpn. J. Appl. Phys. vol. 38, L993-L995 (1999). Cited in Specification.
Arakawa et al., "Development of low concentration doping technique for nitride semiconductors." Proceedings of the 63rd Spring Meeting of The Japan Society of Applied Physics, 2016. Cited in Specification. English machine translation provided.
Nakamura et al. "Dramatic reduction in process temperature of InGaN-based light-emitting diodes by pulsed sputtering growth technique." Applied Physics Letters vol. 104. pp. 051121-1-051121-3 (2014). Cited in Specification and NPL 12, 13 and 14.
Caughey et al. "Carrier Mobilities in Silicon Empirically Related to Doping and Field." Proceedings of the IEEE 55, Dec. 1967. pp. 2192-2193. Cited in Specification.
Mnatsakanov et al., "Carrier mobility model for GaN." Solid-State Electronics. vol. 47. 2003. pp. 111-115. Cited in Specification.
Noguchi et al. "Characteristic of contact resistivity on p-type GaN grown by pulsed sputtering", Proceedings of the 62nd Spring Meeting of The Japan Society of Applied Physics, 2015. pp. 1-3. Cited in Specification. English machine translation provided.
Nikkei Electronics, "LEDs on Glass" NE report, pp. 14-15, Jul. 7, 2014. Cited in Specification. English machine translation provided.
Nakano, "Nitride single crystal growth using PSD method." Published as part of Fujioka, Flexible Devices, published on Mar. 4, 2008, which is cited in the specification. Nakano is project research abstracts pp. 89-94 from Fujioka, Flexible Devices. Entire text of Fujioka, Flexible Devices provided, as well as an English translation of Nakano portion.
Suzuki et al. "Extremely low on-resistance Enhancement-mode GaN-based HFET using Ge-doped regrowth technique" (IEDM14, pp. 275-278 (2014)). Cited in Specification.
International Search Report issued in Intl. Appln. No. PCT/JP2017/020513 dated Sep. 5, 2017. English translation provided.
Written Opinion issued in Intl. Appln. No. PCT/JP2017/020513 dated Sep. 5, 2017. English translation provided.
International Search Report issued in Intl. Appln. No. PCT/JP2018/021122 dated Sep. 4, 2018. English translation provided.
Written Opinion issued in Intl. Appln. No. PCT/JP2018/021122 dated Sep. 4, 2018. English translation provided.
Office Action issued in Japanese Application No. 2018-530815 dated Sep. 4, 2018. Partial English machine translation provided.
Amano et al. "Recent advances in gallium nitride based short wavelength light emitting devices" Journal of Applied Physics, vol. 63, No. 12, pp. 1243-1247, 1994. Partial English machine translation provided.
Nakamura, "Current Status and Future of GaN-Based Light-Emitting Devices" Journal of Applied Physics, vol. 65, No. 7 pp. 676-686, 1996. English machine translation provided.
Nakano et al. "Co-implantation of Si+N into GaN for n-type doping" Journal of Applied Physics, vol. 92, No. 7, pp. 3815-3819, 2002.
Iwaya et al. "Extremely low-resistivity and high-carrier-concentration Si-doped AlGaN with low AlN molar fraction for improvement of wall plug efficiency of nitride-based LED" 11th Conference on Lasers and Electro-Optics Pacific Rim (CLEO-PR), 28C2_2, Optical Society of America, pp. 1-2, Aug. 2015. Cited in NPL 12 and 13.
Low-resistivity n-type aluminium gallium nitride for more efficient LEDs Semiconductor Today, vol. 8 Issue 10, Dec. 2013/Jan. 2014.
Korotkov et al. "Electrical Properties of Oxygen Doped GaN Grown by Metalorganic Vapor Phase Epitaxy" Material Research Society Internet Journal of Nitride Semiconductor Research, vol. 5, Issue S1, pp. 301-307, Jun. 13, 2014. Cited in NPL 14.

(56) References Cited

OTHER PUBLICATIONS

Forte-Poisson et al. "Relationship between physical properties and gas purification in GaN grown by metalorganic vapor phase epitaxy" Journal of Crystal Growth 195, pp. 314-318, 1998.
Ploog et al. "Doping of Group III Nitrides" Journal of Vacuum Science & Technology, A. 16, pp. 1609-1614, 1998.
Gotz et al. "Hall-effect characterization of III-V nitride semiconductors for high efficiency light emitting diodes" Materials Science and Engineering, B99, pp. 211-217, 1999.
Pozina et al. "Effect of Silicon and Oxygen Doping on Donor Bound Excitons in Bulk GaN", Physical Review B 84, 165213-165213-6, 2011.
Ueno et al., "Development of n-type doping technique to GaN by PSD method", Proceedings of the 77th Fall Meeting of The Japan Society of Applied Physics, pp. 1-3. 2016. English machine translation provided.
Ueno et al. "Highly conductive Ge-doped GaN epitaxial layers prepared by pulsed sputtering", Applied Physics Express 10, 101002, pp. 1-5, 2017.
Ueno et al. "Electron transport properties of degenerate n-type GaN prepared by pulsed sputtering" APL Materials 5, pp. 126102-1 to 126102-6, 2017.
Fujioka et al. "High-quality nitride semiconductor growth by sputtering method and its device application", Journal of Applied Physics, vol. 86, No. 7, pp. 576-580, 2017. English machine translation provided.
Nakamura et al. "Development of low temperature fabrication process for nitride-based LEDs", Proceedings of the 60th Spring Meeting of The Japan Society of Applied Physics, pp. 1-3, 2013. English machine translation provided.
Sugiyama et al. "Extremely Low-Resistivity and High-Carrier-Concentration Si-Doped Al0.05Ga0.95N" Applied Physics Express 6, pp. 121002-1 to 121002-3, 2013. Cited in NPL 12 and 13.
Fritze et al. "High Si and Ge n-type doping of GaN doping—Limits and impact on stress", Applied Physics Letters, 100 Volume, pp. 122104-1 to 122104-4, 2012. Cited in NPL 12 and 13.
Ishihara et al. "Preparation of low resistance GaN substrate by HVPE method", Proceedings of the 65th Meeting of The Japan Society of Applied Physics, pp. 282, Sep. 2004. Cited in NPL 12 and 13. English machine translation provided.
Ueno et al. "Development of heavily doped high electron mobility n-type GaN by pulsed sputtering" Proceedings of the 64th Spring Meeting of The Japan Society of Applied Physics, pp. 1-3, 2017. English translation provided.
Arakawa, et al. "Electrical properties of Si-doped GaN prepared using pulsed sputtering", Applied Physics Letters, 110, pp. 042103 to 042103-4, 2017.
Copending U.S. Appl. No. 16/617,212, filed Nov. 26, 2019 (not included because the cited application is not yet available to the public and the Examiner has ready access to the cited application).
Office Action issued in U.S. Appl. No. 16/329,037 dated Jan. 10, 2020.
Office Action issued in U.S. Appl. No. 16/329,037 dated May 14, 2020.
Lee et al. "Effect of Al doping in GaN films grown by metalorganic chemical vapor deposition", Applied Physics Letters. Aug. 4, 2003: pp. 917-919. vol. 83, No. 5. https://aip.scitation.org/doi/pdf/10.1063/1.1597423. Cited in NPL 37.
Extended European Search Report issued in European Appln. No. 17845803.0 dated Apr. 28, 2020.
Notice of Allowance issued in U.S. Appl. No. 16/329,037 dated Sep. 10, 2020.
Office Action issued in Japanese Appln. No. 2019-521337 dated Aug. 4, 2020. English machine translation provided.
Office Action issued in U.S. Appl. No. 16/617,212 dated May 27, 2022 (submitted in view of the second-to-last full paragraph on p. 3 of the Office Action).
Office Action issued in U.S. Appl. No. 16/617,212 dated Jul. 15, 2022.
Office Action issued in U.S. Appl. No. 16/617,212 dated Oct. 28, 2022.

* cited by examiner

RELATIONSHIP BETWEEN MOBILITY AND CARRIER CONCENTRATION OF Si-DOPED n-TYPE GaN

OXYGEN CONCENTRATION OF GaN FILM
PRODUCED BY SPUTTERING (b) Oxygen concentration in the example: 1E18/cc
  (oxygen gas is incorporated at 10 ppm into atmospheric gas)
(a) Oxygen concentration in the comparative example: 1E16/cc

AFM Si-GaN
FIG. 3(a) WITH NO OXYGEN
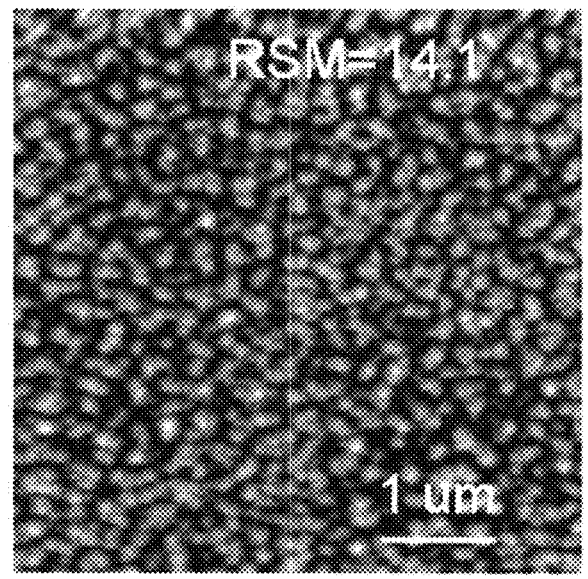
CARRIER CONCENTRATION: 2E20 cm$^{-3}$
FIG. 3(b) WITH OXYGEN
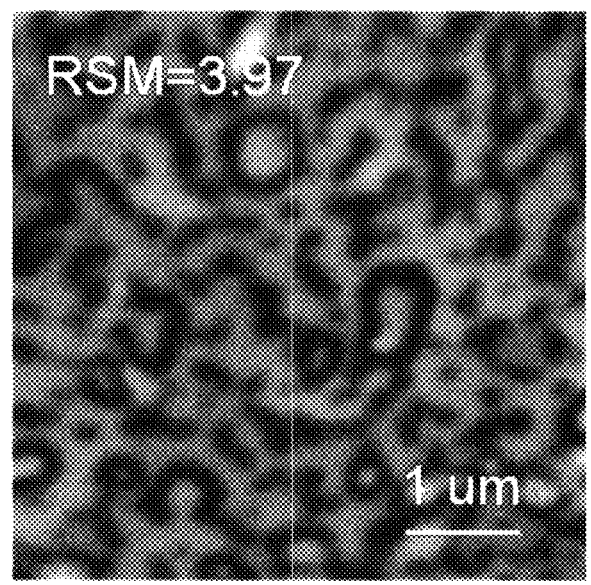
CARRIER CONCENTRATION: 2E20 cm$^{-3}$ ABSORPTION COEFFICIENT AND REFRACTIVE INDEX OF HIGH-CONCENTRATION Si-DOPED GaN FILM PRODUCED BY SPUTTERING

[n]=2E20 cm$^{-3}$

Mobility=115 cm$^2$V$^{-1}$s$^{-1}$

ABSORPTION COEFFICIENT  1860 cm$^{-1}$@405 nm 844 cm$^{-1}$@450 nm (Note) Measured by a spectral ellipsometer

COMPOUND SEMICONDUCTOR, METHOD FOR MANUFACTURING SAME, AND NITRIDE SEMICONDUCTOR

TECHNICAL FIELD

The present invention relates to a compound semiconductor and a method for manufacturing the same.

BACKGROUND ART

Devices using group 13 nitride semiconductors such as GaN and InN are now put into practical use in a wide range of products. Conventionally, an MOCVD method and an MBE method have been used for crystal growth of such a group 13 nitride semiconductor. However, the MOCVD method requires a process temperature exceeding 1000° C. The MBE method allows a compound semiconductor film to be formed at a low temperature, but is not suitable to mass manufacturing because there is a limit on the area size of the film that may be formed and the manufacturing cost is high.

With the MBE method, if donors are incorporated at a high concentration, absorption by the high concentration donor level generated in the forbidden band in the vicinity of the conduction band of the crystal structure occurs. For this reason, the MBE method has a problem that the transparency of the manufactured compound semiconductor film is decreased (Non-patent Document 1). For these reasons, the MOCVD method is now used to manufacture a compound semiconductor, mainly, to manufacture a nitride semiconductor fora practical use.

Currently, next-generation electronic devices having both a high withstand voltage and a low on-resistance are desired. In order to realize such an electronic device, it is desired to realize a two-, three-, or four-component compound semiconductor, more specifically, a compound semiconductor device using a group 13 nitride semiconductor. This requires further improvement in the quality of the crystal of such a compound semiconductor and improvement in the refinement of the doping technology. Especially for a vertical power device to be formed on a GaN substrate, it is urged to decrease the carbon concentration of an n-type drift layer and to improve the electron mobility. There are the following documents describing the prior art.

Patent Document 1 discloses a semiconductor device including a buffer layer formed of a metal nitride and a semiconductor layer, which are provided on a copper substrate.

Patent Document 2 discloses examples of a semiconductor substrate including a graphite plate having a thickness of 10 to 100 μm, containing a sintered polymer and having a heat resistance and flexibility, a buffer layer formed of HfN on the graphite plate, and a semiconductor layer formed of GaN on the buffer layer. Patent Document 3 discloses a method for manufacturing a group-III-V compound semiconductor by epitaxial growth on a ZnO substrate.

Non-patent Document 1 discloses research results on formation of a p-type GaN semiconductor layer. Non-patent Document 2 discloses research results on the contact resistance of a p-type GaN semiconductor layer. Non-patent Document 3 discloses research results on a low concentration doping technology into a nitride semiconductor. Non-patent Document 4 discloses research results on a transport model of electrons in a high electric field. Non-patent Document 5 discloses research results on a model of carrier mobility of GaN. Non-patent Document 6 discloses research results on evaluation of the contact resistance against a p-type GaN formed by a PSD method. Non-patent Document 7 discloses examples of experiments of producing an LED on glass. Non-patent Document 8 discloses research results on a nitride single crystal grown by the PSD method.

CITATION LIST

Patent Literature

Patent Document 1: Japanese Laid-Open Patent Publication No. 2008-243873
Patent Document 2: WO2011/021248A1
Patent Document 3: Japanese Laid-Open Patent Publication No. 2010-56435
Patent Document 4: Japanese Laid-Open Patent Publication No. 2016-115931
Patent Document 5: United States Patent Application Publication 2016/0172473

Non-Patent Literature

Non-patent Document 1: G. T. Zhao et al., Jpn. J. Appl. Phys. 38, L933 (1999;
Non-patent Document 2: Arakawa et al., The Japan Society of Applied Physics, 63rd Spring Meeting, 20p-H121-8
Non-patent Document 3: E. Nakamura et al., Appl. Phys. Lett. 104, 051121 (2014)
Non-patent Document 4: D. M. Caughey et al, Proc. IEEE 55, 2192 (1967)
Non-patent Document 5: T. T. Mnatsakanov et al, Solid-State Electron, 47, 111 (2003)
Non-patent Document 6: Proceedings, The Japan Society of Applied Physics, 62nd Spring Meeting
Non-patent Document 7: Nikkei Electronics, NE report, pp. 14-15, Jul. 7, 2014
Non-patent Document 8: Fujioka "Flexible Device" project research abstracts pp. 89-94 (published on Mar. 4, 2008)
Non-patent Document 9: A, Suzuki et al., "Extremely low on-resistance Enhancement-mode GaN-based HFET using Ge-doped regrowth technique" (IEDM14, pp. 275-278 (2014))

SUMMARY OF INVENTION

Technical Problem

With the conventional technology, in the case where it is attempted to realize crystal growth of a group 13 nitride semiconductor by the MOCVD method, carbon and hydrogen contained in the material gas are incorporated into the film. This causes a problem that it is difficult to form a high quality film having a low concentration of impurities such as carbon, hydrogen and the like.

In addition, in the case where it is attempted to realize crystal growth of a group 13 nitride semiconductor by the MOCVD method, it is generally difficult that a film having a donor concentration of $5 \times 10^{19}$ cm$^{-3}$ or higher exhibits an electron mobility of about 46 cm$^2$/V·s or higher due to thermodynamic restrictions. The MOCVD method is based on a chemical reaction. Therefore, it is in fact impossible to realize crystal growth at a low temperature, and carbon and hydrogen contained in the material gas are easily incorporated into the manufactured film.

As a crystal growth method of a nitride semiconductor replacing the MOCVD method, a pulse sputter deposition (PSD) method is now proposed. It has been demonstrated that a p-type GaN thin film having a low concentration of residual hydrogen and exhibiting a high hole mobility is obtained by the PSD method (Non-patent Document 2).

Currently, the MOCVD method is used to manufacture an electronic device and a light emitting device on a nitride semiconductor substrate for practical use. However, it is difficult to produce, by the MOCVD method, an n-type layer having a high donor concentration which are important to decrease the resistance of these devices. Therefore, there are very few reports on the characteristics of such an n-type layer.

As can be seen, it is desired to develop a group 13 nitride semiconductor of n-type conductivity that exhibits a high electron mobility even in a region of a high donor concentration. In such a situation, it is required to realize a semiconductor material exhibiting as high an electron mobility as possible in order to achieve the purposes of improving the performance, saving the energy, and improving the efficiency of electronic devices and light emitting devices.

The present invention, made in light of such a problem, has an object of easily manufacturing and providing a two-, three- or four-component compound semiconductor, more specifically, a group 13 nitride semiconductor film, of n-type conductivity that exhibits a high electron mobility even in a region of a high donor concentration.

Solution to Problem

In order to solve the above-described problem, embodiment 1 of the first invention provides a two-, three-, or four-component compound semiconductor containing nitrogen and one element selected from the group consisting of B, Al, Ga and In, which are group 13 elements, wherein the compound semiconductor contains oxygen as an impurity at $1 \times 10^{17}$ cm$^{-3}$ or higher, the compound semiconductor has an electron concentration of $5 \times 10^{19}$ cm$^{-3}$ or higher and has n-type conductivity, and the compound semiconductor exhibits an electron mobility of 46 cm$^2$/V·s or higher.

Embodiment 2 of the first invention provides the compound semiconductor according to embodiment 1, in which the compound semiconductor contains Ga and N as main components.

Embodiment 3 provides the compound semiconductor according to embodiment 2, in which the compound semiconductor has an absorption coefficient of 2000 cm$^{-1}$ or lower to light having a wavelength region of 405 nm.

Embodiment 4 provides the compound semiconductor according to embodiment 2, in which the compound semiconductor has an absorption coefficient of 1000 cm$^{-1}$ or lower to light having a wavelength region of 450 nm.

Embodiment 5 provides the compound semiconductor according to any one of embodiments 1 to 4, in which the compound semiconductor has an RMS value of 5.0 nm or less obtained by a surface roughness measurement performed by an AFM.

Embodiment 6 provides the compound semiconductor according to any one of embodiments 1 to 5, in which the compound semiconductor has a contact resistance of $1 \times 10^{-4}$ Ω·cm$^2$ or lower against an n-type ohmic electrode metal.

Embodiment 7 provides the compound semiconductor according to any one of embodiments 1 to 6, in which the compound semiconductor contains Ga as the group 13 element and further contains Al and/or In as the group 13 element.

Embodiment 8 provides the compound semiconductor according to any one of embodiments 1 to 7, in which the compound semiconductor contains Si as a donor.

Embodiment 9 provides the compound semiconductor according to any one of embodiments 1 to 7, in which the compound semiconductor contains Ge as a donor.

Embodiment 10 provides a contact structure, comprising a conductive portion and an electrode connected with each other, the conductive portion being formed using the compound semiconductor according to any one of embodiments 1 to 9.

Embodiment 11 provides a semiconductor device, comprising the contact structure according to embodiment 10.

Embodiment 12 provides a transparent electrode formed using the compound semiconductor according to any one of embodiments 1 to 9.

Embodiment 13 provides a method for manufacturing a compound semiconductor, the method comprising forming a film using the compound semiconductor according to any one of embodiments 1 to 9 by a pulse sputtering method in a process atmosphere containing oxygen.

Embodiment 14 provides the method for manufacturing a compound semiconductor according to embodiment 13, in which the film is formed at a substrate temperature of 700° C. or lower.

According to the first present invention, a two-component nitride refers to a compound of one element among B, Al, Ga and In, and nitrogen. Namely, the two-component nitride is a two-component mixed crystal of BN (boron nitride), AlN (aluminum nitride), GaN (gallium nitride) or InN (indium nitride).

A three-component nitride refers to a compound obtained as a result of any one of the two-component group 13 elements mentioned above being partially replaced with another group 13 element. The three-component nitride is, for example, a three-component mixed crystal of InGaN (indium gallium nitride), AlGaN (aluminum gallium nitride), or AlInN (aluminum indium nitride). Regarding the three-component compound, it is known that the composition ratio thereof may be adjusted to adjust the bandgap within the range of the characteristics of the two-component compound.

Even a compound containing a trace amount of another group 13 element in addition to the group 13 acting as a main component of the compound semiconductor may also be encompassed in the scope of the above-described invention. Combinations of elements are arbitrary as long as the effects of the present invention are not impaired.

The second invention is directed to a nitride semiconductor having n-type conductivity and containing nitrogen and at least one group 13 element selected from the group consisting of B, Al, Ga and In, in which the nitride semiconductor has an electron concentration of $1 \times 10^{20}$ cm$^{-3}$ or higher and exhibits a specific resistance of $0.3 \times 10^{-3}$ Ω·cm or lower.

Preferably, the electron concentration is $2 \times 10^{20}$ cm$^{-3}$ or higher.

Preferably, the nitride semiconductor has a contact resistance of 1–$10^{-4}$ Ω·cm$^2$ or lower against an n-type ohmic electrode metal.

In an embodiment, the nitride semiconductor contains oxygen as an impurity at $1 \times 10^{17}$ cm$^{-3}$ or higher.

Preferably, the nitride semiconductor has an absorption coefficient of 2000 cm$^{-1}$ or lower to light having a wavelength region of 405 nm.

Preferably, the nitride semiconductor has an absorption coefficient of 1000 cm$^{-1}$ or lower to light having a wavelength region of 450 nm.

Preferably, the nitride semiconductor has an RMS value of 5.0 nm or less obtained by a surface roughness measurement performed by an AFM.

In an embodiment, the at least one group 13 element is Ga.

In an embodiment, the nitride semiconductor contains either one of, or both of, Si and Ge as donor impurities.

The lower limit of the specific resistance is, for example, $0.2 \times 10^{-3}$ Ω·cm, $0.15 \times 10^{-3}$ Ω·cm, or $0.1 \times 10^{-3}$ Ω·cm.

The relationship between the electron concentration of the specific resistance of the nitride semiconductor fulfills a numerical range enclosed by four points at which (a) the electron concentration is $1 \times 10^{20}$ cm$^{-3}$ and the specific resistance is $0.3 \times 10^{-3}$ Ω·cm, (b) the electron concentration is $3 \times 10^{20}$ cm$^{-3}$ and the specific resistance is $0.3 \times 10^{-3}$ Ω·cm, (c) the electron concentration is $4 \times 10^{20}$ cm$^{-3}$ and the specific resistance is $0.15 \times 10^{-3}$, and (d) the electron concentration is $9 \times 10^{20}$ cm$^{-3}$ and the specific resistance is $0.15 \times 10^{-3}$ Ω·cm.

The above-described invention is applicable to a contact structure, comprising the nitride semiconductor for a conductive portion. The above-described invention is also applicable to a contact structure, comprising the nitride semiconductor for an electrode. Such a contact structure is usable in a semiconductor device.

ADVANTAGEOUS EFFECTS OF INVENTION

The nitride compound semiconductor according to the present invention exhibits a high electron mobility of 46 cm$^2$/V·s or higher even in a region of a high electron concentration of $5 \times 10^{19}$ cm$^{-3}$ or higher. The electron mobility is preferably 50 cm$^2$/V·s or higher, and more preferably 60 cm$^2$/V·s or higher.

However, the electron mobility of 50 cm$^2$/V·s or higher may not be needed depending on the specifications, use or the like of the semiconductor device. In such a case, the electron concentration and the oxygen content may be adjusted in consideration of the productivity thereof, so that a compound semiconductor exhibiting an electron mobility of 30 cm$^2$/V·s or higher is manufactured and applied to a structural portion of the device for which such a compound semiconductor is needed.

According to the present invention, the pulse sputtering method (PSD method) is used to form a sputtered single crystal film with no high-temperature process. More preferably, a compound semiconductor film is formed in a process performed generally at room temperature. There is no limit on the area size of the substrate, and films of various sizes from a small size to a large size may be manufactured.

For example, a compound semiconductor film of a rectangular outer shape having a length of a side of 2 inches or longer or a compound semiconductor film of a circular outer shape having a diameter of 2 inches or longer may be formed. Alternatively, a compound semiconductor film having an area size that is 30 cm$^2$ or larger and having an allowable area within the restriction of the internal space of the sputtering apparatus may be formed.

In this case, a high quality compound semiconductor film is easily formed with no need of a buffer layer, which is required by the conventional technology.

Now, the properties of the compound semiconductor according to the present invention will be described. The specific resistance ρ of an n-type nitride semiconductor film is in inverse proportion to the electron mobility $\mu_n$ and the carrier concentration n. Therefore, the n-type nitride semiconductor film exhibiting a high electron mobility even at a high electron concentration indicates that a high quality film having a low electric resistance is formed. Namely, the present invention provides a high quality group 13 nitride semiconductor film easily usable for a semiconductor device. The compound semiconductor according to the present invention has a threading dislocation density of about $1 \times 10^6$/cm$^2$ to about $5 \times 10^{10}$/cm$^2$.

BRIEF DESCRIPTION OF DRAWINGS

FIGS. 3(a) and 3(b) show AFM images of surfaces of the Si-doped GaN films shown in FIG. 2 formed by sputtering.

DESCRIPTION OF EMBODIMENTS

Hereinafter, a compound semiconductor manufactured by pulse-sputtering using a group 13 nitride semiconductor will be described as an embodiment according to the present invention with reference to the drawings.

A group 13 nitride semiconductor according to an embodiment of the present invention is formed as a film by a pulse sputter deposition method (PSD method).

Pulse Sputtering Method

The "pulse sputtering method (PSD method)" used to manufacture a compound semiconductor of a nitride according to the present invention, and the materials and the manufacturing method used to manufacture the compound semiconductor, are basic items well known to a person of ordinary skill in the art.

For example, the standard technologies disclosed in the following publications are usable to work the present invention with no problem: "Growth of a nitride substrate and a lattice-matched substrate and device characteristics" (CMC Publishing Co., Ltd.; first edition published on Oct. 30, 2009), "New development of high frequency semiconductor materials and devices" (CMC Publishing Co., Ltd.; first edition published on Nov. 13, 2006), "Improvement in performance of next-generation power semiconductors and industrial development thereof" (CMC Publishing Co., Ltd.; first edition published on Jun. 10, 2015), Japanese Laid-Open Patent Publication No. 2009-138235 "Pulse sputtering apparatus, and pulse sputtering method", Japanese Laid-Open Patent Publication No. 2014-159368 "Gallium nitride sintered body or gallium nitride molded article, and method for producing the same", and the like. Patent Documents 2 and 3, and Non-patent Documents 3 and 4, and the like may also be referred to.

According to the PSD method used in the present invention, crystal growth advances based on a physical reaction, and therefore, may be performed at a low temperature. In addition, carbon and hydrogen in a film formation environment are conspicuously removable. Since the crystal growth may be performed at a low temperature, generation of a thermal stress in the film is suppressed, and also a compound easily causing phase separation such as, for example, InGaN, is stably grown.

Figure 5A:
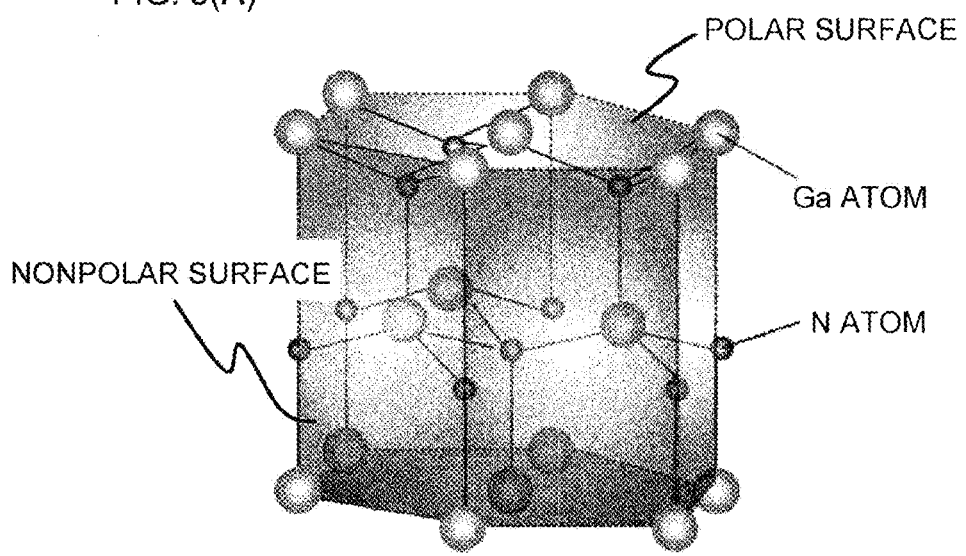
FIGS. 5(A) and 5(B) provide a schematic view (A) and a schematic view in a planar direction (B) each showing a crystal structure of GaN.
Figure 5B:
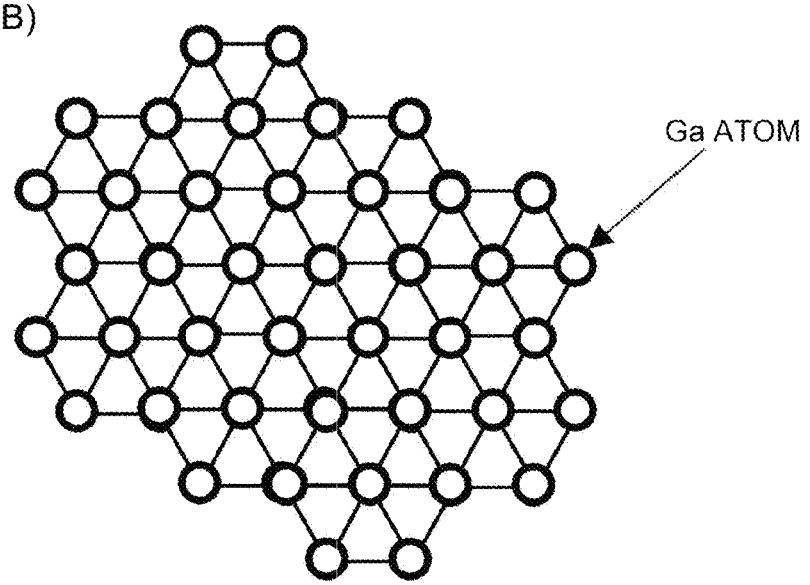

Single crystal growth of a compound semiconductor according to the present invention is not visually recognizable directly, but the principle of action of the crystal growth is generally considered as follows. FIG. 5 shows a crystal structure of GaN, which is one of two-component group 13 compounds. During the film formation of a compound semiconductor according to the present invention, it is considered that a polar surface at which Ga atoms of GaN are located to form a hexagonal shape (Ga atom surface) is aligned to a surface of a substrate acting as an underlying layer, so that a single crystal structure is formed.

In this step, with the manufacturing method used in the present invention, the film formation is allowed to be performed at a relatively low temperature, instead of at a high temperature exceeding 1000° C. required by the MOCVD method or the like. The temperature range to be used is 700° C. or lower and may include room temperature of 25° C. (room temperature to 700° C.). Although the temperature varies in accordance with the film formation rate, a preferable temperature range may be, for example, 300 to 700° C.

For this reason, it is estimated that a small number of oxygen atoms contained in the film formation atmosphere are present to cover a surface of the film to be formed during the film formation. It is considered that as a result of the above, the oxygen atoms act to prevent the bonding of the group 13 element and nitrogen, and therefore, the film formation process advances while main elements to form the desired compound are kept free.

In addition, it is considered that since the film formation conditions are the same for the entirety of the underlying layer in a planar direction, a crystal structure that is uniform and has a high level of crystallinity entirely is formed.

The GaN compound semiconductor formed as a sputtered film in this manner is considered to gradually grow in an axial direction of the hexagonal shape (thickness direction of the film), so that in a final step, a compound semiconductor film that is uniform in the plane and has at least a certain area size is manufactured.

It is preferred that the underlying layer to be used is formed of a material fulfilling the condition of having a lattice matched with, or matched in a pseudo manner with, the compound semiconductor to be grown. The film formation process by the PSD method is not performed at a high temperature exceeding 1000° C. Therefore, the material of the underlying layer does not need to be resistant against a high temperature. However, in order to improve the crystallinity, it is preferred that the crystal and the underlying layer fulfill the conditions of being lattice-matched or pseudo-lattice-matched with each other.

For the above-described reasons, according to the present invention, it is especially preferred that the material of the underlying layer is selected from the four types: SiC, sapphire, GaN, single crystalline silicon. Sapphire has a heat resistant temperature of 1200° C., and single crystalline silicon has a heat resistant temperature of 1100° C. These materials are usable to manufacture semiconductor devices such as AlGaN/GaN HEMTs, full-color LEDs, InGaN-TFTs, sensors and the like.

Alternatively, the material of the underlying layer may be, for example, metal foil or alkali-free glass for FPD having a heat resistant temperature of 600 to 700° C., or the like, although the formed crystal quality of the compound semiconductor is inferior to the quality in the case where the above-listed materials are used. In this case, it is preferred that a buffer layer is formed on a surface of the material of the underlying layer for the crystal growth, for the purpose of making the underlying layer pseudo-lattice-matched with the compound semiconductor.

Regarding the size of the film to be formed according to the present invention, a device having a length of a shorter side or a diameter of a circle of 2 inches to 10 inches may be manufactured. The present invention is also applicable to a medium-sized device having a diagonal line of a rectangle of 10 to 30 inches and a large device having a diagonal line of a rectangle of 30 inches or longer. The device or the substrate acting as the underlying layer may be circular, square, rectangular, or of an asymmetrical shape.

Figure 6:
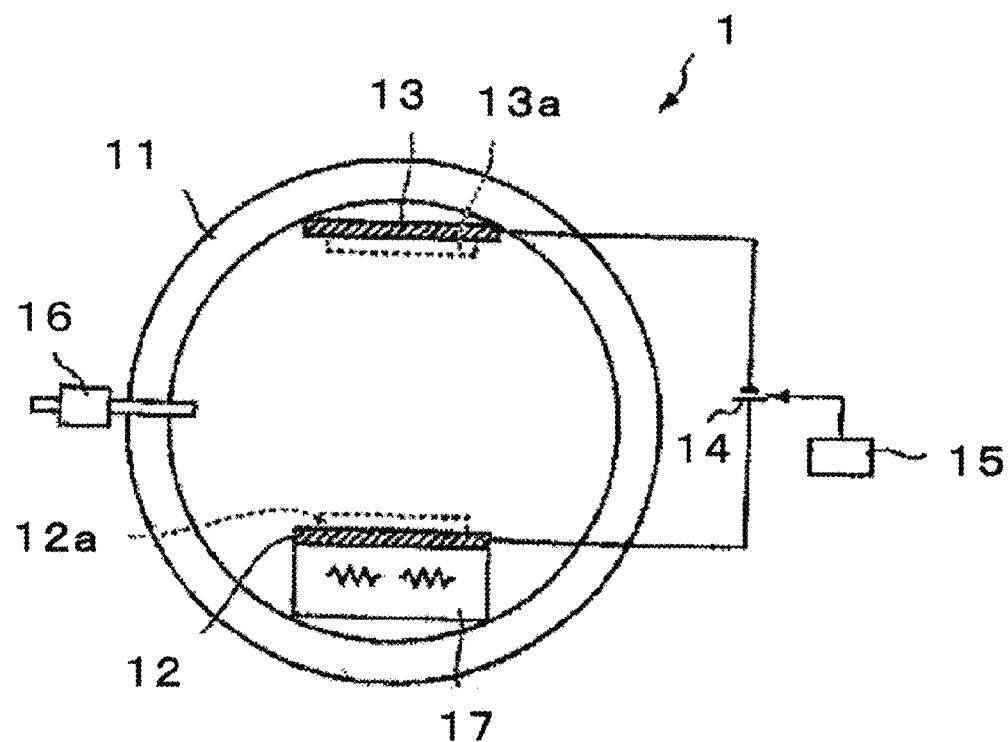
FIG. 6 is a schematic view showing a structure of a sputtering apparatus usable in the present invention.
Figure 7:
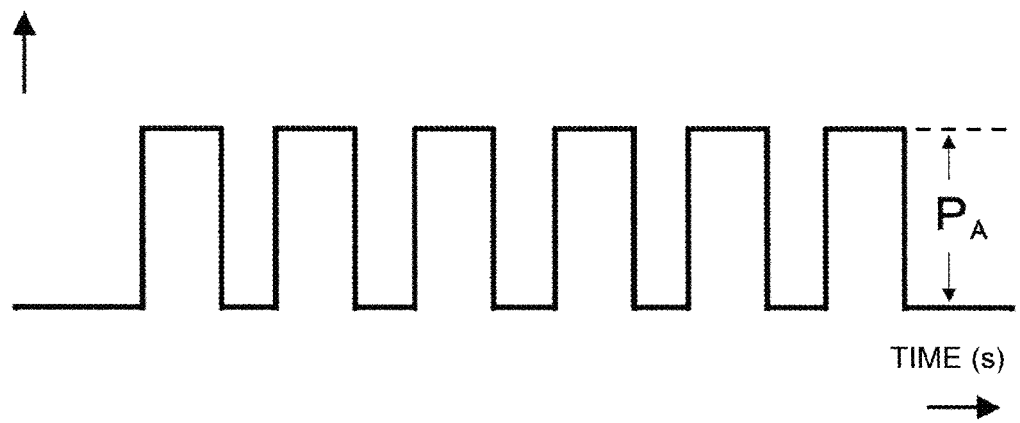
FIG. 7 is a graph showing an example of pulse sequence to be applied to an electrode of the sputtering apparatus at the time of sputtering according to the present invention.

FIG. 6 and FIG. 7 respectively show a schematic view of a sputtering apparatus and a pulse sequence usable to manufacture a compound semiconductor according to the present invention. A sputtering apparatus 1 mainly includes a chamber 11, a substrate electrode 12, a target electrode 13, a DC power supply 14, a power supply controller 15, a nitrogen supply source 16, a heating device and the like.

The chamber 11 is sealable against the outside. The inner pressure of the chamber 11 is allowed to be decreased by a vacuum pump or the like (not shown). The substrate electrode 12 is located in the chamber 11, and is capable of holding a heat dissipation sheet 12a.

The target electrode 13 is provided in the chamber 11 so as to face the substrate electrode 12, and is capable of holding a target 13a. The target 13a is formed of a compound of a group 13 element and nitrogen. A high quality target material with little impurities that is currently available in general is used. For example, a high quality material such as the five-nine or six-nine level is needed.

The DC power supply 14 is electrically connected with the substrate electrode 12 and the target electrode 13, and is a voltage source that applies a DC voltage between the substrate electrode 12 and the target electrode 13.

The power supply controller 15 is connected with the DC power supply 14, and performs control regarding the timing of the operation of the DC power supply 14. The power supply controller 15 allows a pulse voltage to be applied between the substrate electrode 12 and the target electrode 13.

The nitrogen supply source 16 is connected with the inside of the chamber 11 by, a supply tube or the like, and supplies nitrogen gas into the chamber 11. Although not shown, an argon gas supply source that supplies argon gas into the chamber is also provided in addition to the nitrogen gas supply source 16.

An oxygen supply source that supplies a predetermined amount of oxygen is also provided. The internal pressure is constantly allowed to be monitored while the film is formed. The content of oxygen in the chamber needs to be controlled to be kept at about 10 ppm substantially constantly during the film formation of the compound semiconductor.

In order to realize this, it is indispensable that the chamber used for the pulse sputtering, the supply system of the process gas and the discharge system of the process gas (main discharger, rough discharger) prohibit gas leak and invasion of external air, and it is important that the pressure is controlled to be highly stable during the film formation. It is considered to be fundamental to supply a trace amount of oxygen into the chamber intentionally. In order to realize this, the chamber needs to be confirmed to have been cleaned, and the materials to be used need to have a high purity.

The heating device 17 is secured to, for example, the substrate electrode 12, so that the temperature around the heat dissipation sheet 12a on the substrate electrode 12 is adjustable. The representative examples of the film formation conditions to be used according to the present invention are as follows. FIG. 7 is an example of pulse sequence. The voltage $P_A$ of the driving pulse is adjustable. The film formation rate is generally 0.1 to 4 nm/sec. on average, and more preferably 0.2 to 2 nm/sec.

(a) Driving method: pulse sputtering method (PSD method)
(b) Duty ratio: 5%
(c) Average power: 100 V
(d) Pulse frequency: 1 kHz
(e) Growth pressure: $2 \times 10^{-3}$ Torr
(f) Dopant: Si The film formation by the sputtering was performed in atmospheric gas containing argon as a main component, and the substrate temperature during the film formation was set to the range of 300 to 700° C. In this case, doping gas such as $SiH_4$, $GeH_4$ or the like is usable as the doping material, and a target containing Si or Ge atoms is usable, in order to form a high concentration n-type group 13 nitride compound semiconductor.

Experiments were made in which oxygen were incorporated at a concentration of 10 ppm into the atmospheric gas to be used for the sputtering in order to introduce oxygen into the film of the target compound semiconductor to be manufactured, and in which oxygen was not incorporated. Physical characteristics of the compound semiconductor manufactured with oxygen and the compound semiconductor manufactured with no oxygen were checked in comparison with each other.

Figure 8:
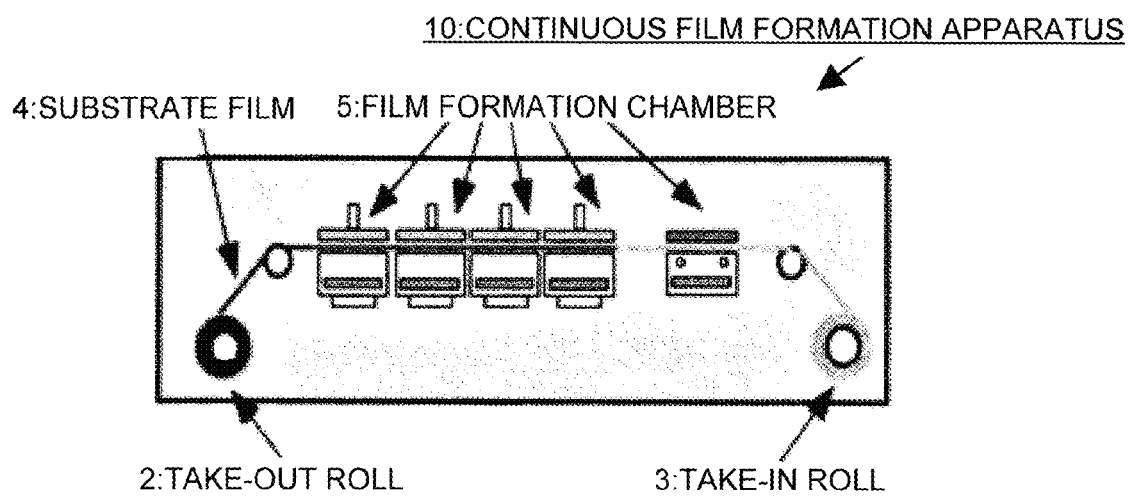
FIG. 8 is a schematic vertical cross-sectional view showing an inner structure of a sputtering apparatus usable in the present invention.

FIG. 8 is a schematic vertical cross-sectional view of a continuous film formation apparatus 10 of a roll-to-roll system. A plurality of film formation chambers 5 are provided inside the continuous film formation device 10. The present invention is applicable to such a device as long as the substrate film 4 is a metal foil or a very thin film-like glass substrate that may be taken into a roll or taken out of a roll. While the flexible substrate film 4 is transported in a horizontal direction from a take-out roll 2 to a take-in roll 3, the sputtering may be performed toward the substrate film 4 at a plurality of locations in the film formation chamber. As a result, a semiconductor device containing a desired compound semiconductor or the like is processed at a high speed. The table in the chamber is usable for, for example, a diameter of 320 to 600 mm.

According to the present invention, crystal growth of a compound semiconductor is realized on an underlying layer or a substrate having an area size defined by a shorter side of a rectangle or a diameter of at least 2 inches. The crystal is manufactured at a low temperature and at a high rate so as to have a certain area size and to be uniform. In addition, a novel compound semiconductor is mass-manufactured while the manufacturing cost thereof is suppressed.

Figure 1:
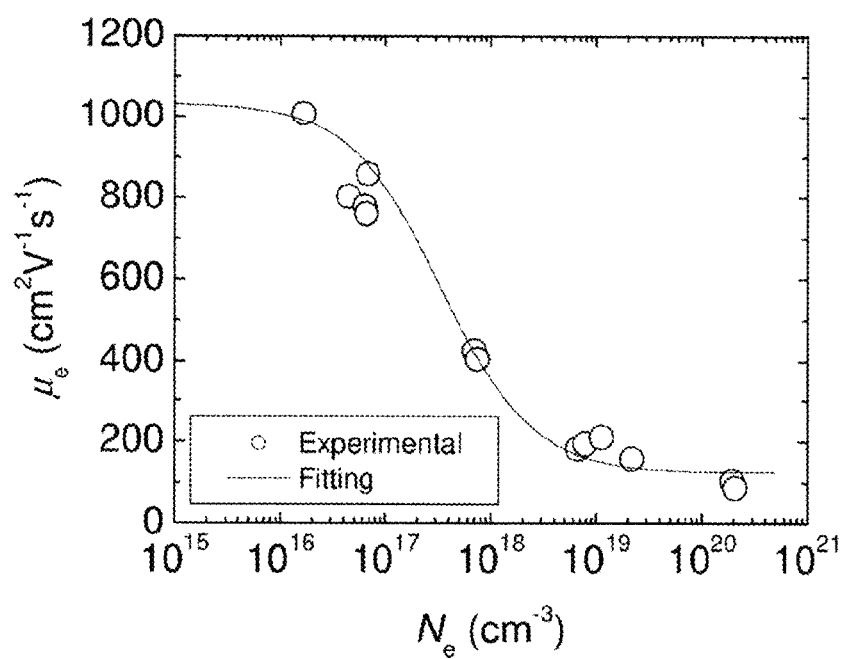
FIG. 1 is a graph showing the relationship between the electron concentration ($N_e$) and the electron mobility ($\mu_e$) of a Si-doped n-type GaN film produced by a PSD method.

FIG. 1 shows the relationship between the electron concentration ($N_e$) and the electron mobility ($\mu_e$) of a Si-doped n-type GaN film produced by the PSD method by the present inventors. The electron concentration and the electron mobility were determined by a room temperature Hall effect measurement. The electron concentration ($N_e$) is considered to be substantially equal to the Si donor concentration. The film formation by the sputtering was performed in atmospheric gas containing argon gas as a main component, and the substrate temperature during the film formation was in the range of 300 to 700° C.

Oxygen was incorporated at a concentration of 10 ppm into the atmospheric gas to be used for the sputtering for the purpose of introducing oxygen into this film, so that a crystal film exhibiting single crystallinity was formed. An n-type ohmic electrode metal stack structure (Ti (20 nm)/Al (60 nm)/Ti (20 nm)/Au (50 nm)) was formed on a surface of the resultant GaN thin film, and was annealed in nitrogen at 700° C. The contact resistance of samples formed in this manner was evaluated by a TLM method and was found to be $8.5 \times 10^{-5}$ Ω·cm².

In this figure, the circles show the actually measured values, and the curve shows the fitting result based on the Caughey-Thomas-type empirical formula (formula 1 below; see Non-patent Document 4), which is used to describe the mobility in a low electric field. In the formula below, $N_D$ is the donor concentration. Since the electron concentration ($N_e$) is considered to be substantially equal to the Si donor concentration as described above, the fitting is performed with an assumption that $N_D = N_e$.

$$\mu = \mu_{min} + [\mu_{max} - \mu_{min}]/[1+(N_D/N_R)^\gamma] \quad (1)$$

From the above-shown fitting result, $\mu_{max}$=1034 cm$^2$/V·s, $\mu_{min}$=125 cm$^2$/V·s were found. These values are comparable to the highest value of the mobility of the n-type GaN thin film formed by the MOCVD method conventionally reported (see, for example, Non-patent Document 5). As can be seen, it has been confirmed that the carrier scattering is sufficiently suppressed in the film of the compound semiconductor manufactured according to the present invention.

With the MOCVD method of the conventional technology, it is considered to be difficult to form a GaN thin film exhibiting such a high electron mobility when the donor concentration is generally 5×10$^{19}$ cm$^{-3}$ or higher. According to the present invention, as shown in FIG. 1, the Si-doped n-type GaN film produced by the PSD method exhibits the values matching the Caughey-Thomas-type empirical formula even at the donor concentration of at least 2×10$^{20}$ cm$^{-3}$.

Namely, it has been found out that an n-type GaN film according to this example produced by the PSD method is a very high quality film exhibiting an electron mobility of 46 cm$^2$/V·s or higher even at an electron concentration of 5×10$^{19}$ cm$^{-3}$ or higher. Preferably, a film exhibiting an electron mobility of 50 cm$^2$/V·s or higher is usable. The specific resistance p of an n-type nitride semiconductor film is in inverse proportion to the electron mobility $\mu_n$ and the carrier concentration n. Therefore, the n-type nitride semiconductor film exhibiting a high electron mobility even at a high electron concentration indicates that a high quality film having a low resistance is formed.

The samples shown in FIG. 1 are all Si-doped. The impurity to be incorporated as a donor is not limited to Si and may be Ge or the like.

When the donor concentration of the nitride semiconductor film is increased in order to realize a high electron concentration, the transparency of the film to visible light is decreased. This causes a concern that an inconvenience may occur in the case where the nitride semiconductor film according to the present invention is used for a transparent electrode or the like.

Under such circumstances, according to the present invention, the decrease in the transparency caused by the increase in the electron concentration of the film of the compound semiconductor is compensated for as follows. The nitrogen site is replaced, so that oxygen, which is a dopant acting as a donor, is incorporated as an impurity to expand the bandgap of the film.

The bandgap of an oxygen-doped film depends on the amount of doping. For example, in the case of GaN, the bandgap at room temperature may be varied in the range of 3.4 eV to 4.9 eV (value of the bandgap of gallium oxide). In the case of, for example, GaN, when oxygen is incorporated as an impurity at 1×10$^{17}$ cm$^{-3}$ or higher into the film, the bandgap at room temperature is generally about 3.4 to about 3.6 eV.

Such an effect of oxygen, for example, allows the nitride semiconductor film according to this example to have an absorption coefficient of 2000 cm$^{-1}$ or less to light having a wavelength region of 405 nm or to have an absorption coefficient of 1000 cm$^{-1}$ or less to light having a wavelength region of 450 nm. In this manner, the nitride semiconductor film according to this example is usable for a transparent electrode with no inconvenience.

Figure 2:
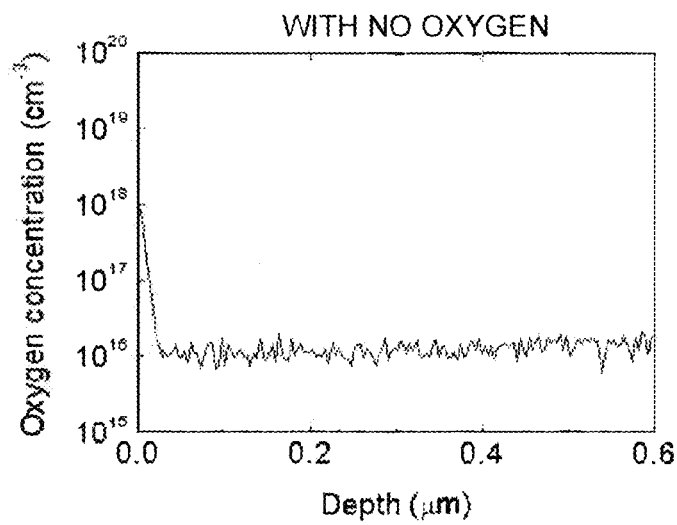
FIGS. 2(a) and 2(b) provide graphs of SIMS data each showing a profile, in a depth direction, of the oxygen concentration of a GaN film having a Si concentration of $2 \times 10^{20}$ cm$^{-3}$.
Figure 2:
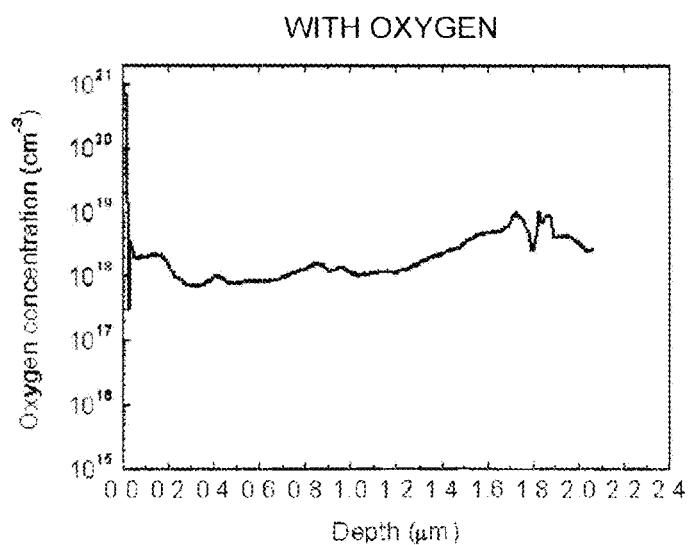

FIG. 2 provides graphs each showing an oxygen concentration of the GaN film according to this embodiment manufactured by the PSD method. FIG. 2(b) shows SIMS data representing a profile, in a depth direction, of the oxygen concentration of a GaN film having a Si concentration of 2×10$^{20}$ cm$^{-3}$, among the samples shown in FIG. 1. It is understood that the oxygen is contained at a concentration of about 1 to 3×10$^{18}$ cm$^{-3}$. This film exhibits an electron mobility of 110 cm$^2$/V·s.

The RMS value of an AFM image representing the surface roughness of this film was 3.97 nm as seen from FIG. 3(b). The present inventors performed an AFM measurement on the film samples formed by the present inventors at various electron concentrations and containing oxygen at an electron concentration of 5×10$^{19}$ cm$^{-3}$ or higher. All the samples had an RMS value of 5.0 nm or less.

In the meantime, crystal growth was performed under substantially the same conditions but with no incorporation of 10 ppm oxygen into the atmospheric gas. The results were as follows. As shown in the profile in FIG. 2(a), the oxygen concentration was about 1×10$^{16}$ cm$^{-3}$, and the mobility at this point was 45 cm$^2$/V·s. As seen from FIG. 3(a), the RMS value representing the surface roughness of this thin film was 14.1 nm.

Now, the two conditions, namely, the condition of incorporating oxygen and the condition of not incorporating oxygen, will be discussed. In the case with oxygen, it is considered that oxygen atoms in the atmosphere covering a surface of the film that is being formed cause the stress to alleviate and the migration of the atoms at the surface to promote. It is considered that this suppression on the surface roughness suppresses introduction of point defects and thus improves the mobility. At a high temperature used by the MOCVD method or the like of the conventional technology, oxygen evaporates from the surface. Therefore, it is considered to be difficult to provide the effect of improving the quality realized by the low-temperature growth performed by the PSD method.

By contrast, in the case with no oxygen, it is considered that the above-described action is not easily provided and thus the crystal of the film formed by the PSD method is likely to include defects.

Figure 4A:
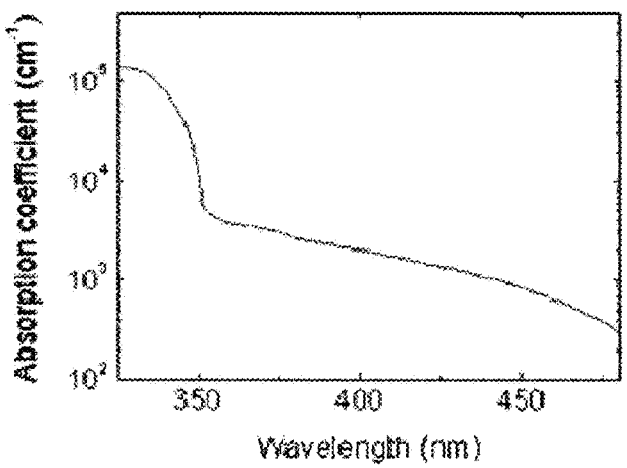
FIGS. 4(a) and 4(b) provide graphs respectively showing the absorption coefficient and the refractive index of a GaN film having a Si concentration (electron concentration) of $2 \times 10^{20}$ cm$^{-3}$ measured by an ellipsometer.
Figure 4B:
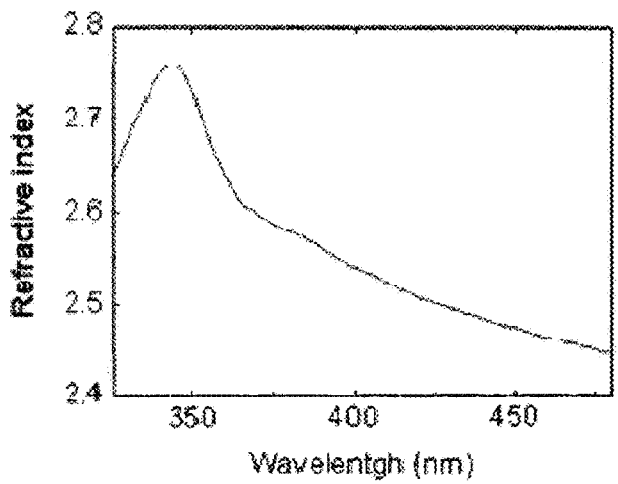

FIG. 4 provides graphs showing the absorption coefficient (FIG. 4(a)) and the refractive index (FIG. 4(b)) of a GaN film having a Si concentration (electron concentration) of 2×10$^{20}$ cm$^{-3}$ measured by an ellipsometer. This film exhibits an electron mobility of 115 cm$^2$V·s. This film has an absorption coefficient of 844 cm$^{-1}$ at a wavelength of 450 nm, which is used for a blue LED as a standard wavelength, and has an absorption coefficient of 1860 cm$^{-1}$ at a wavelength of 405 nm, which is used for a blue-violet laser as a standard wavelength.

As can be seen, the oxygen doping allows the film to have an absorption coefficient of 2000 cm$^{-1}$ or less to light having a wavelength region of 405 nm or to have an absorption coefficient of 1000 cm$^{-1}$ or less to light having a wavelength region of 450 nm. As a result, the obtained compound semiconductor is usable as a transparent material.

Hereinafter, various forms of electronic device to which a compound semiconductor according to the present invention is applicable.

Embodiment 1

Figure 9:
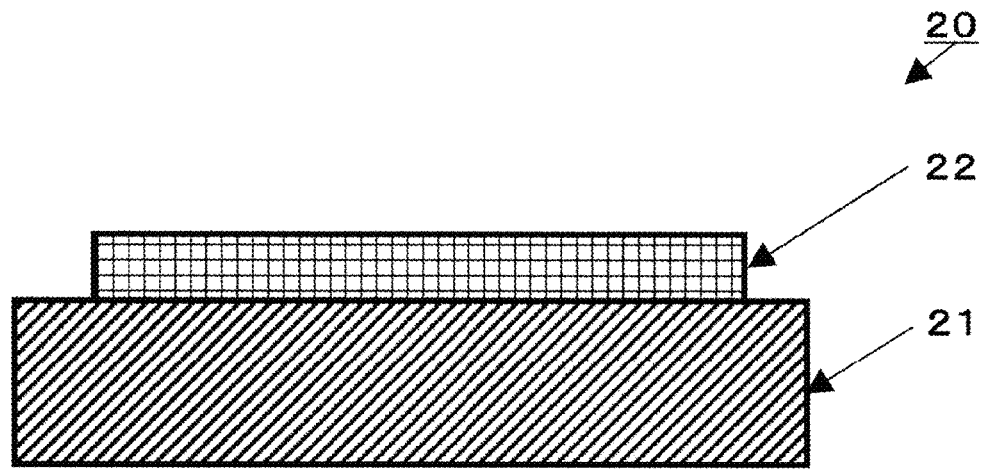
FIG. 9 is a schematic cross-sectional view of a semiconductor device according to embodiment 1 of the present invention.

FIG. 9 is a schematic cross-sectional view of a compound semiconductor device 20 including a group 13 nitride semiconductor formed on a substrate. Reference sign 21 represents the substrate (sapphire), and reference sign 22 represents GaN.

Embodiment 2

Figure 10:
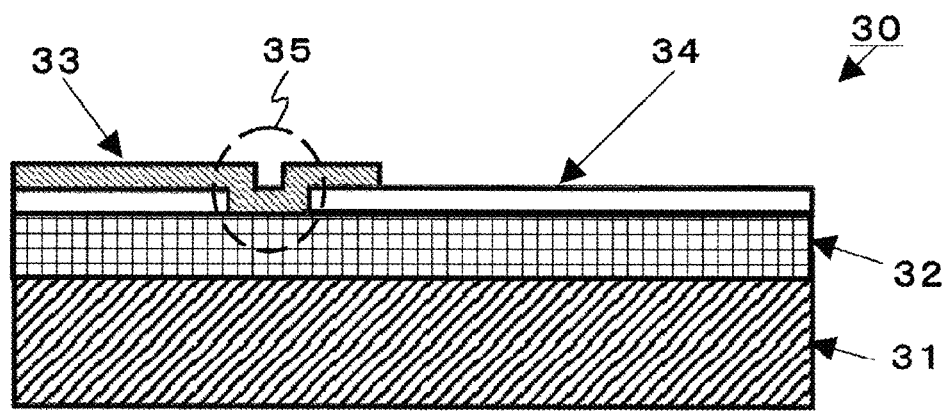
FIG. 10 is a schematic cross-sectional view showing a contact structure according to embodiment 2 of the present invention.

FIG. 10 is a schematic cross-sectional view of a contact structure formed using a compound semiconductor according to the present invention. Reference sign 31 represents a GaN substrate, reference sign 32 represents GaN (film of a compound semiconductor formed by the PSD method), reference sign 34 represents an insulating film, reference sign 33 represents a wiring electrode connectable with an external device, and reference sign 35 represents a contact hole.

Embodiment 3

Figure 11:
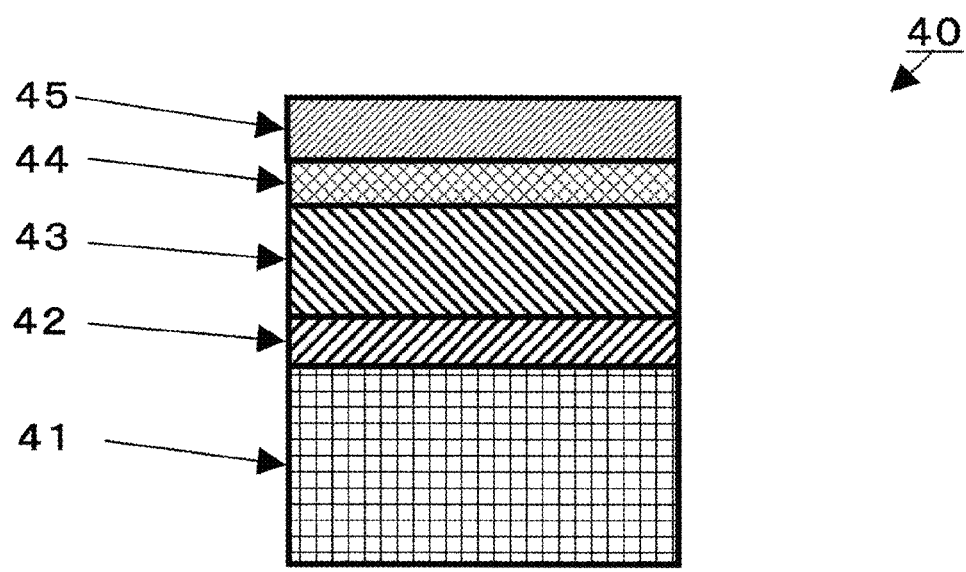
FIG. 11 is a schematic cross-sectional view showing a contact structure according to embodiment 3 of the present invention.

FIG. 11 is a schematic cross-sectional view of a contact structure 40 formed using a group 13 nitride compound semiconductor according to the present invention. In FIG. 11, reference sign 41 represents an n-type GaN contact layer, reference sign 42 represents a Ti layer, reference sign 43 represents an Al layer, reference sign 44 represents an Ni layer, and reference sign 45 represents an Au layer. In this example, a composite metal electrode is used. After the film formation, heat treatment is performed at about 900° C.

Application Examples

Figure 12:
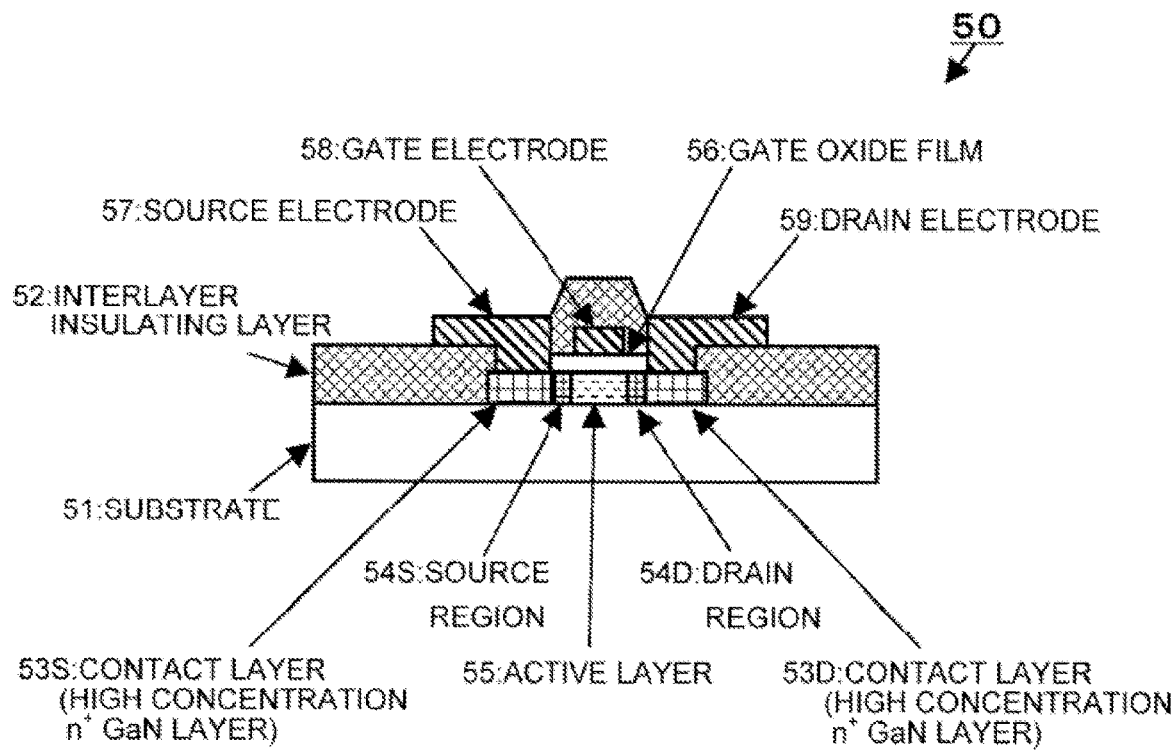
FIG. 12 is a schematic cross-sectional view of a thin film transistor to which the present invention is applicable.

FIG. 12 is a schematic cross-sectional view of a thin film transistor to which the present invention is applicable. A high concentration n-type GaN layer is applicable as a contact layer of an electrode of the thin film transistor.

In the figure, reference sign 51 represents a substrate formed of alkali-free glass or the like, reference sign 52 represents an interlayer insulating layer, reference sign 53S represents a source-side contact layer (high concentration n⁺ GaN layer), reference sign 54S represents a source region, reference sign 55 represents an active layer, reference sign 54D represents a drain region, reference sign 53D represents a drain-side contact layer (high concentration n⁺ GaN layer), reference sign 56 represents a gate oxide film, reference sign 57 represents a source electrode, reference sign 58 represents a gate electrode, and reference sign 59 represents a drain electrode. The source region 54S and the drain region 54D are each formed such that the concentration of the impurity is gradually changed between the corresponding contact layer and the active layer.

Figure 13:
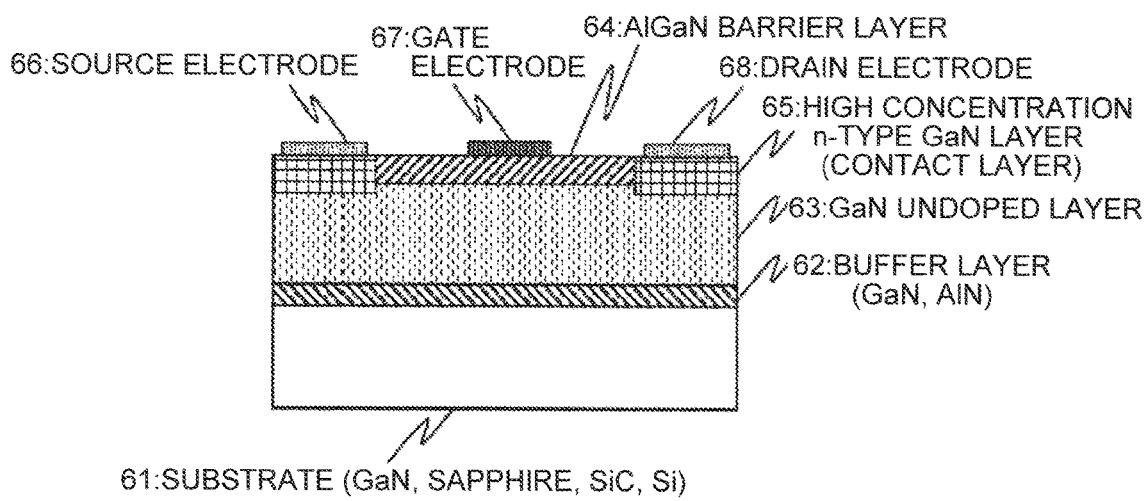
FIG. 13 is a schematic cross-sectional view of an AlGaN/GaN HEMT to which the present invention is applicable.

FIG. 13 is a schematic cross-sectional view of a HEMT to which the present invention is applicable. A high concentration n-type GaN layer according to the present invention is applicable as contact layers located below, and in contact with, source and drain electrodes of the HEMT of AlGaN/GaN. In the figure, reference sign 61 represents a substrate formed of GaN, sapphire, SiC, Si or the like, reference sign 62 represents a buffer layer formed of GaN, AlN or the like, reference sign 63 represents a GaN undoped layer, reference sign 64 represents an AlGaN barrier layer, and reference sign 65 represents a contact layer formed using a high concentration n-type GaN layer. A source electrode 66, a gate electrode 67 and a drain electrode 68 are provided in a top part of the HEMT.

In the thin film transistor (FIG. 12) and the HEMT (FIG. 13) described above, the high concentration n-type GaN layer is applicable as the contact layer. The contact resistance of such a contact layer against an electrode in a circuit element in which an operating current flows (the circuit element is each of source and drain in these devices) is significantly decreased. This significantly contributes to the improvement in performance of the electronic device.

Figure 14:
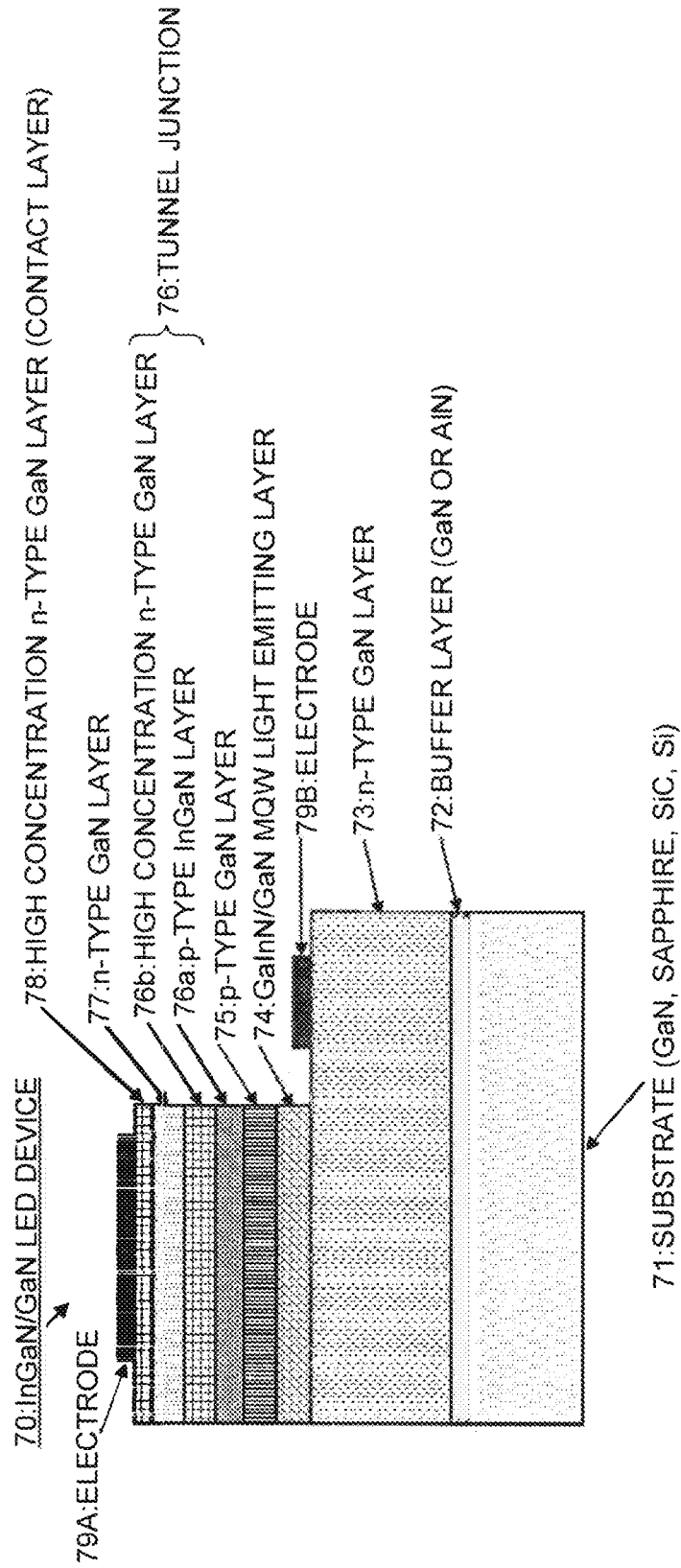
FIG. 14 is a schematic cross-sectional view of an LED device to which the present invention is applicable.

FIG. 14 is a schematic cross-sectional view of an LED device as an example of GaN-based semiconductor device to which the present invention is applicable.

As shown in this figure, a plurality of compound semiconductor layers are sequentially stacked from the side of a substrate 71 formed of GaN, sapphire, SiC or Si. A buffer layer 72, an n-type GaN layer 73, a GaInN/GaN MQW light emitting layer 74, a p-type GaN layer 75, a tunnel junction 76 including a p-type InGaN layer 76a and a high concentration n-type GaN layer 76b, an n-type GaN layer 77, a contact layer 78 formed of a high concentration n-type GaN layer, and electrodes 79A and 79B are provided.

Figure 15:
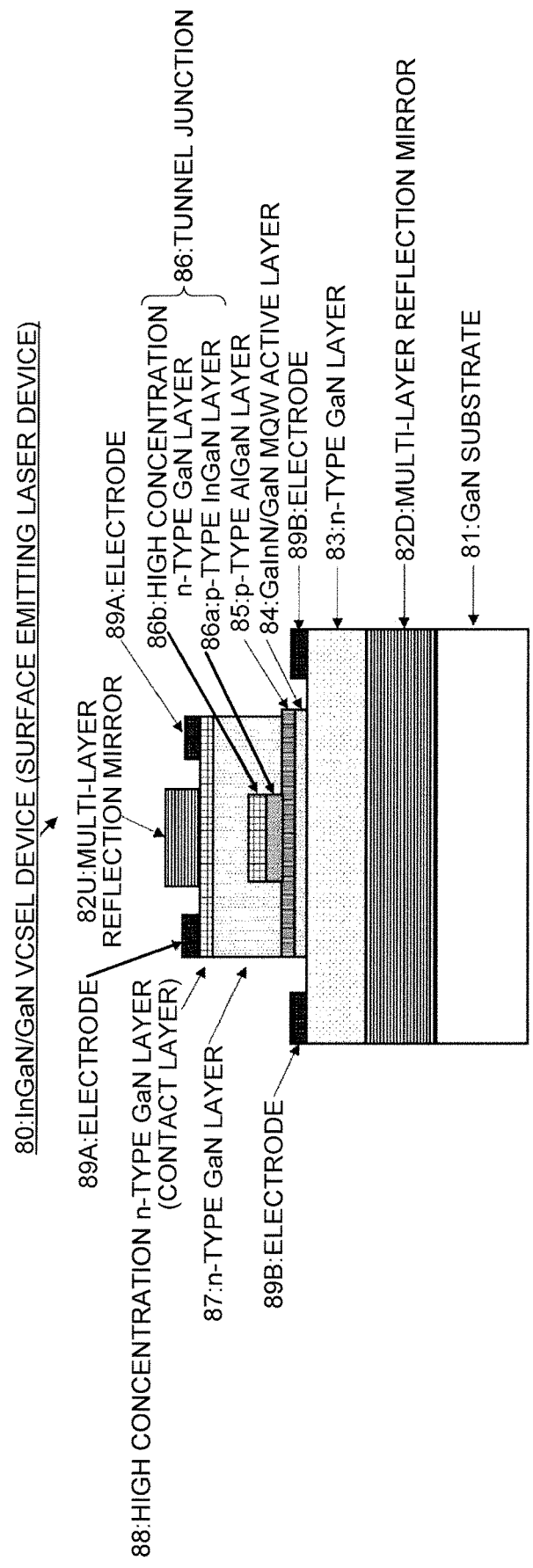
FIG. 15 is a schematic cross-sectional view of a surface emitting laser device to which the present invention is applicable.

FIG. 15 is a schematic cross-sectional view of an InGaN/GaN VCSEL (surface emitting laser) structure to which the present invention is applicable. In such a vertical cavity surface emitting laser (VCSEL), a resonator is formed to be perpendicular to a surface of a semiconductor substrate. Therefore, laser light is output perpendicularly to the substrate surface.

In the figure, reference sign 81 represents a GaN substrate, reference sign 82D represents an inner multi-layer reflection mirror, reference sign 83 represents an n-type GaN layer, reference sign 84 represents an MQW active layer formed of GaInN/GaN, reference sign 85 represents a p-type AlGaN layer, reference sign 86a represents a p-type InGaN layer, and reference sign 86b represents a high concentration n-type GaN layer. 86a and 86b form a tunnel junction 86. Reference sign 87 represents an n-type GaN layer, reference sign 88 represents a high concentration n-type GaN layer (contact layer), reference sign 89A and 89B represent electrodes, and reference sign 82U represents an upper multi-layer reflection mirror.

As described above, the compound semiconductor according to the present invention is usable for, for example, regions of a light emitting device or an electronic device in which a large amount of electric current flows, a contact portion of a semiconductor device, or an electrode structure such as a transparent electrode or the like. The compound semiconductor according to the present invention is preferably usable for a wire or the like of an electronic device drivable at a very low voltage. The compound semiconductor according to the present invention is adaptable to the specifications of large electric current and large electric power, which are not easily dealt with by the conventional technology.

The compound semiconductor according to the present invention exhibits a high electron mobility and thus has a low resistance, and therefore is considered to contribute to improvement in the operation speed of devices.

So far, a compound semiconductor according to the present invention, namely, a two-, three- or four-component compound semiconductor that contains nitrogen and one element selected from the group consisting of B, Al, Ga and In, which are group 13 elements, contains oxygen as an impurity at $1 \times 10^{17}$ cm$^{-3}$ or higher, has an electron concentration of $5 \times 10^{19}$ cm$^{-3}$ or higher, has n-type conductivity and exhibits an electron mobility of 46 cm$^2$/V·S or higher has been described.

Hereinafter, a nitride semiconductor according to a second invention made by the present inventors will be described.

The nitride semiconductor has a conspicuous feature of exhibiting a lower specific resistance (namely, exhibiting a higher mobility) than a conventional semiconductor although being in the form of a crystal doped with a donor at a high concentration.

Specifically, the nitride semiconductor contains nitrogen and at least one group 13 element selected from the group consisting of B, Al, Ga and In, has n-type conductivity, exhibits an electron concentration of $1 \times 10^{20}$ cm$^{-3}$ or higher, and exhibits a specific resistance of $0.3 \times 10^{-3}$ Ω·cm or lower. Preferably, the at least one group 13 element is Ga, and either one of, or both of, Si and Ge are contained as donor impurities.

Conventionally, a nitride semiconductor doped with Ge grown by the MBE method at a high concentration and exhibiting a relatively low specific resistance is known. As compared with such a nitride semiconductor, the nitride semiconductor according to the present invention realizes a lower specific resistance in a region having a higher electron concentration.

Such a nitride semiconductor exhibiting a low specific resistance (exhibiting a high mobility) although being in the form of a crystal doped with donors at a high concentration is expected to be used for various uses, for example, to decrease the parasitic resistance of an electronic device such as a HEMT or the like, to provide a material replacing a transparent conductive film of ITO or the like, and to realize cascade connection of LED modules.

Figure 16:
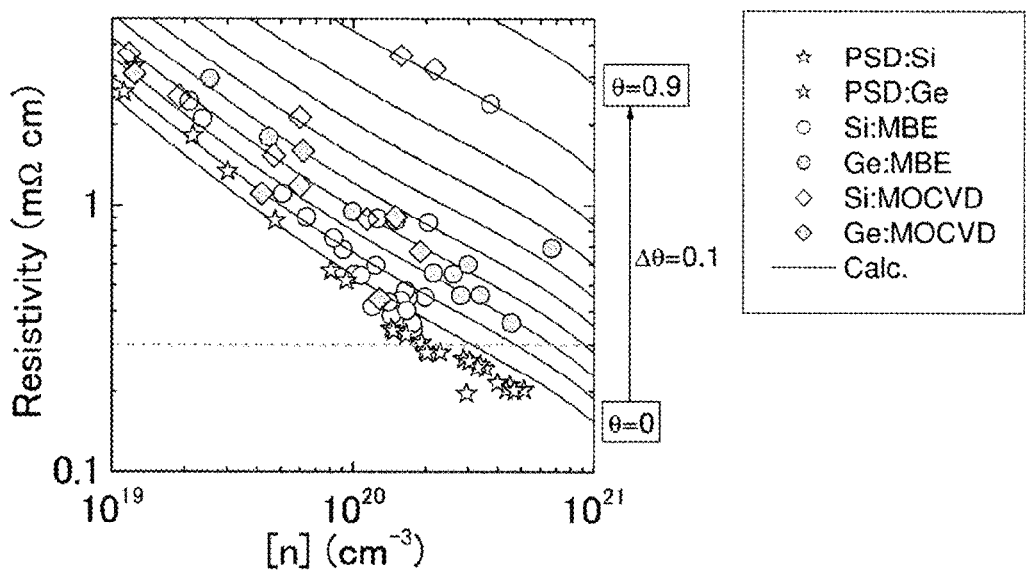
FIG. 16 shows the relationship between the electron concentration and the resistivity of GaN according to the present invention.

FIG. 16 shows the relationship between the electron concentration (cm$^{-3}$) and the resistivity (mΩ·cm) of GaN according to the present invention. In the figure, star marks represent the GaN according to the present invention. Among the star marks, white star marks represent Si-doped GaN, and gray star marks represent Ge-doped GaN. The figure also shows, for comparison, data of GaN obtained by the MOCVD method (diamond-shaped marks) and the MBE method (circular marks) reported so far, and also shows the relationship between the electron concentration and the resistivity obtained by a theoretical calculation. In the figure, θ represents the compensation ratio of the concentration of ionized impurities (ratio of the acceptor concentration $N_A$ and the donor concentration $N_D$; $N_A/N_D$).

The GaN crystal conventionally reported exhibits a tendency that the specific resistance is decreased as the electron concentration is increased regardless of whether the crystal is obtained by the MBE method or the MOCVD method. However, the specific resistance is increased when the electron concentration is above a certain level.

For example, in the case of GaN obtained by the MOCVD method, Si-doped GaN shows an increase in the specific resistance from when the electron concentration exceeds about $5 \times 10^{19}$ cm$^{-3}$, and Ge-doped GaN shows an increase in the specific resistance from when the electron concentration exceeds about $1 \times 10^{20}$ cm$^{-3}$. In the case of GaN obtained by the MBE method, Si-doped GaN shows an increase in the specific resistance from when the electron concentration exceeds about $1.5 \times 10^{20}$ cm$^{-3}$, and Ge-doped GaN shows an increase in the specific resistance from when the electron concentration exceeds about $5 \times 10^{20}$ cm$^{-3}$.

By contrast, in the case of GaN according to the present invention, neither Si-doped GaN (white marks) nor Ge-doped GaN (gray marks) shows any such increase in the specific resistance even when the electron concentration is $5 \times 10^{20}$ cm$^{-3}$.

In addition, in the case of the conventional GaN, even Ge-doped GaN, obtained by the MBE method and exhibiting the lowest specific resistance in a region of a high electron concentration, exhibits a specific resistance of merely 0.4 mΩ·cm ($0.4 \times 10^{-3}$ Ω·cm) at the minimum at an electron concentration of about $5 \times 10^{20}$ cm$^{-3}$. By contrast, the GaN according to the present invention exhibits a specific resistance of 0.2 mΩ·cm ($0.2 \times 10^{-3}$ Ω·cm) at generally the same electron concentration.

As is clear from the results shown in this figure, unlike the conventional GaN, the GaN according to the present invention has a feature of exhibiting a conspicuously low specific resistance of $0.3 \times 10^{-3}$ Ω·cm or lower especially when the electron concentration is $1 \times 10^{20}$ cm$^{-3}$ or higher, and this feature is not lost even when the electron concentration is $2 \times 10^{20}$ cm$^{-3}$ or higher. As shown in the table below, this tendency has been experimentally confirmed in the range of specific resistance down to $0.196 \times 10^{-3}$ Ω·cm. The theoretical value of the lowest limit of the resistance value caused by scattering of ionized impurities is $0.04 \times 10^{-3}$ Ω·cm, but is varied to, for example, $0.2 \times 10^{-3}$ Ω·cm, $0.15 \times 10^{-3}$ Ω·cm, $0.1 \times 10^{-3}$ Ω·cm or the like depending on the film formation conditions or the like.

Figure 17:
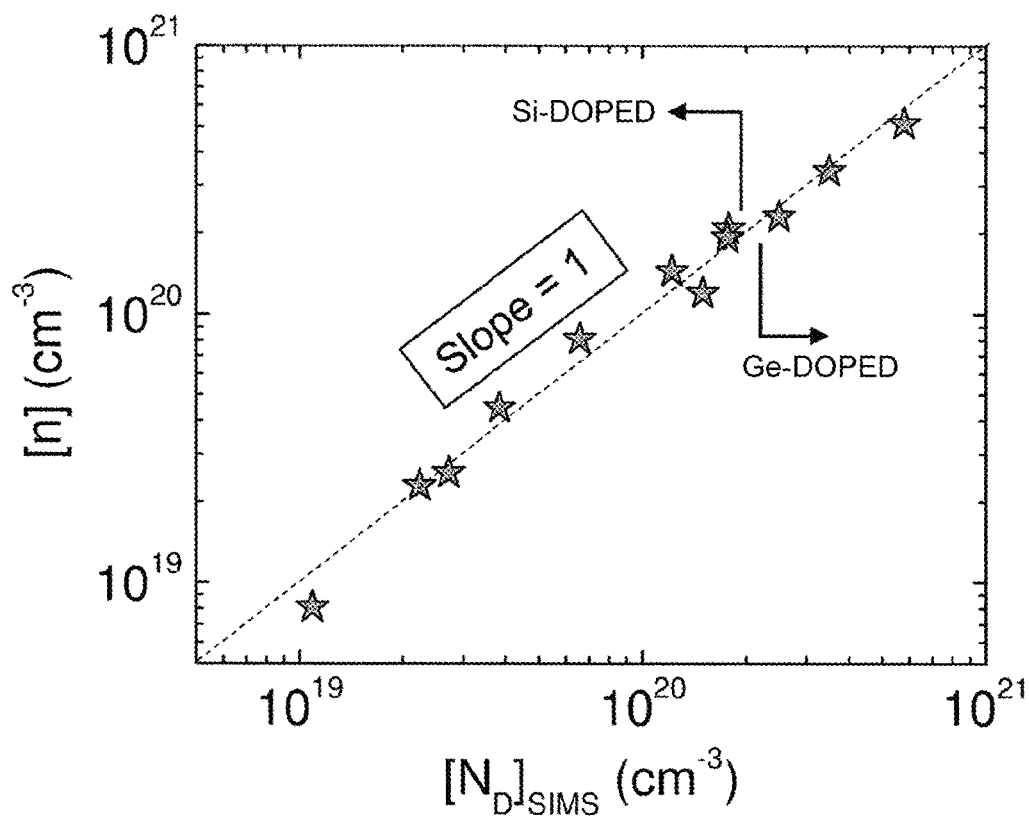
FIG. 17 shows the relationship between the concentrations of donor impurities and the electron concentrations, of the GaN according to the present invention, obtained by a SIMS measurement.
Figure 18D:
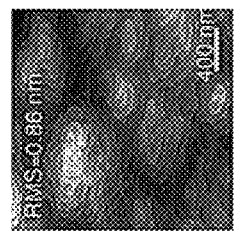
FIGS. 18(a), 18(b), 18(c), and 18(d) provide AFM images of surfaces of Ge-doped GaN samples as examples of surface state of GaN.
Figure 18C:
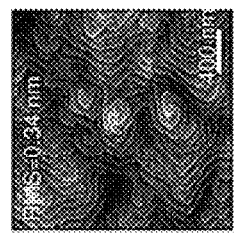
Figure 18B:
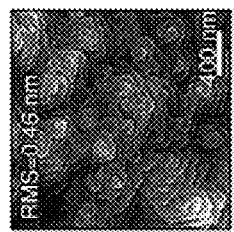
Figure 18A:
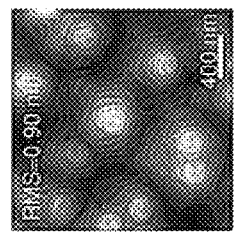

FIG. 17 shows the relationship between the concentration of the donor impurities and the electron concentrations, of the GaN according to the present invention, obtained by a SIMS measurement. It is understood from these results that the activation ratio of the donors is about 1 in the GaN according to the present invention obtained by the PSD method. Namely, it is understood that for the GaN according to the present invention, the electron concentration is controllable by merely controlling the doping concentration of the donor impurity.

The various characteristics (electron concentration, electron mobility, specific resistance, and surface roughness) of the GaN according to the present invention are shown in Table 1 (Si-doped GaN) and Table 2 (Ge-doped GaN).

TABLE 1

| Si-doped GaN | | | |
|---|---|---|---|
| Electron concentration (cm$^{-3}$) | Electron mobility (cm$^2$ V$^{-1}$ s$^{-1}$) | Specific resistance (m Ω · cm) | Surface roughness RMS value (nm) |
| 1.12E+19 | 211 | 2.64 | 0.85 |
| 2.16E+19 | 159 | 1.82 | 0.95 |
| 3.02E+19 | 154 | 1.34 | 0.94 |
| 4.75E+19 | 150 | 0.876 | 0.70 |
| 8.09E+19 | 136 | 0.567 | 0.90 |
| 9.36E+19 | 128 | 0.521 | 0.88 |
| 1.44E+20 | 126 | 0.344 | 0.65 |
| 1.47E+20 | 126 | 0.337 | 0.75 |
| 1.66E+20 | 115 | 0.327 | 0.55 |
| 1.93E+20 | 106 | 0.305 | 0.88 |
| 1.99E+20 | 110 | 0.285 | 0.95 |
| 2.03E+20 | 110 | 0.279 | 0.68 |
| 2.95E+20 | 108 | 0.196 | 0.76 |

TABLE 2

| Ge-doped GaN | | | |
|---|---|---|---|
| Electron concentration (cm$^{-3}$) | Electron mobility (cm$^2$ V$^{-1}$ s$^{-1}$) | Specific resistance (m Ω · cm) | Surface roughness RMS value (nm) |
| 1.24E+19 | 153 | 3.29 | 0.91 |
| 2.03E+20 | 96.8 | 0.280 | 0.77 |
| 2.87E+20 | 82.1 | 0.265 | 0.62 |
| 3.04E+20 | 79.0 | 0.260 | 0.62 |
| 3.24E+20 | 74.6 | 0.258 | 0.54 |
| 3.28E+20 | 77.4 | 0.246 | 0.46 |
| 3.36E+20 | 73.8 | 0.252 | 0.46 |
| 3.39E+20 | 70.2 | 0.262 | 0.31 |

TABLE 2-continued

Ge-doped GaN

| Electron concentration (cm$^{-3}$) | Electron mobility (cm$^2$ V$^{-1}$ s$^{-1}$) | Specific resistance (m Ω · cm) | Surface roughness RMS value (nm) |
|---|---|---|---|
| 3.54E+20 | 72.2 | 0.244 | 0.34 |
| 3.99E+20 | 73 | 0.214 | 0.35 |
| 4.11E+20 | 70.4 | 0.216 | 0.65 |
| 4.35E+20 | 70.9 | 0.202 | 0.65 |
| 4.49E+20 | 66.2 | 0.210 | 0.55 |
| 4.70E+20 | 66.2 | 0.200 | 0.55 |
| 5.15E+20 | 60.1 | 0.202 | 0.86 |
| 5.25E+20 | 57.8 | 0.207 | 0.86 |
| 5.49E+20 | 41.3 | 0.275 | 0.86 |

The GaN shown in Table 1 and Table 2 is all obtained in generally the same conditions as the crystal growth conditions by the PSD method described above. The materials and the like each having the following purity were used. The electron concentration was changed by changing the power applied to the cathode from 20 to 150 W.

Substrate temperature during the growth: 600 to 700° C.
Sputtering target (Si): single crystal having a purity of 99.999%
Sputtering target (Ge): single crystal having a purity of 99.99%
Ga: Purity: 99.99999%
Nitrogen gas: purity: 99.9999%

The present inventors note that the vacuum level of the film formation environment and the quality of the vacuum state are important for growing a high quality crystal, and appropriately adjusted the conditions of pulse sputtering (pulse voltage, pulse width, duty ratio, etc.) in order to obtain a crystal of a desired film quality. It is one of advantages of the PSD method that such fine adjustments may be made quickly.

The measurement conditions and the like for the above-mentioned various properties are as follows.

The electron concentration and the electron mobility were measured by use of a Hall measurement device (ResiTest8400, Toyo Corporation) while the applied current was varied in the range of 1 mA to 10 mA and the applied magnetic field was varied in the range of 0.1 to 0.5 T (tesla) in accordance with the resistivity of the sample. The temperature for the measurement was room temperature.

The surface roughness was measured by use of an AFM device (JSPM4200 produced by JEOL Ltd.).

FIG. 18 shows AFM images of surfaces of the Ge-doped GaN samples as examples of surface state of the above-described GaN. These samples all have an RMS value less than 1 nm. In general, a surface having an RMS value, obtained by a surface roughness measurement by an AFM device, of 5.0 nm or less may be evaluated to be sufficiently flat. In consideration of this, it is understood that the nitride semiconductor according to the present invention has a highly flat surface.

Nitride semiconductor crystals having the Ga site of GaN be partially replaced with Al or In (AlGaN or InGaN) were also produced, and various properties thereof were examined. The results are shown in Table 3 and Table 4. These samples each have an Al concentration of 1% and an In concentration of 1%. The purity and the like of each of the materials used for the crystal growth are as follows.

Substrate temperature during the growth: 600 to 700° C.
Sputtering target (Si): single crystal having a purity of 99.999%
Sputtering target (Ge): single crystal having a purity of 99.99%
Ga: Purity: 99.99999%
Al: Purity: 99.999%
In: Purity: 99.999%
Nitrogen gas: purity: 99.9999%

TABLE 3

Ge-doped AlGaN

| Electron concentration (cm$^{-3}$) | Electron mobility (cm$^2$ V$^{-1}$ s$^{-1}$) | Specific resistance (m Ω · cm) |
|---|---|---|
| 476E+20 | 61.7 | 0.213 |

TABLE 4

Si-doped InGaN

| Electron concentration 4.76(cm$^{-3}$) | Electron mobility (cm$^2$ V$^{-1}$ s$^{-1}$) | Specific resistance (m Ω · cm) |
|---|---|---|
| 2.32E+20 | 98.4 | 0.273 |

The contact resistance of each of the nitride semiconductors shown in Table 1 to Table 4 was measured. It has been confirmed that all the samples have a contact resistance of $1 \times 10^{-4}$ Ω·cm$^2$ or less against an n-type ohmic electrode metal. Such a value is sufficiently low. A contact structure including any of the above-described nitride semiconductors for a conductive portion is expected to be used in various uses, for example, to decrease the parasitic resistance of an electronic device such as a HEMT or the like, to provide a material replacing a transparent conductive film of ITO or the like, and to realize cascade connection of an LED module.

The contact resistance was measured by use of a TLM (Transmission Line Model) measurement apparatus (semiconductor parameter analyzer Agilent 4155C) on a TLM pattern including Ti/Al/Ti/Au electrode structures (100 μm×100 μm) located at an inter-electrode distance of 2 μm to 100 μm.

As described above, the nitrogen site of the nitride semiconductor may be replaced, so that oxygen, which is a dopant acting as a donor, is incorporated as an impurity to expand the bandgap of the film. In this manner, the decrease in the transparency caused by the increase in the electron concentration of the film of the nitride semiconductor is compensated for.

For this purpose, for example, oxygen as an impurity is incorporated at $1 \times 10^{17}$ cm$^{-3}$ or higher into the above-described nitride semiconductor. Such incorporation of oxygen as an impurity allows the nitride semiconductor to have an absorption coefficient of 2000 cm$^{-1}$ or less to light having a wavelength region of 405 nm or to have an absorption coefficient of 1000 cm$^{-1}$ or less to light having a wavelength region of 450 nm.

The above-described nitride semiconductor according to the present invention is formed by the PSD method. The present inventors consider that the above-described characteristics are obtained for the following reason: with the other crystal growth methods, the crystal growth advances in a thermal equilibrium state, whereas with the PSD method, the crystal growth advances in a thermal non-equilibrium state.

A nitride semiconductor such as GaN or the like doped with a donor at a high concentration is thermodynamically unstable, and therefore, is partially decomposed even while the crystal growth is advancing. Namely, the growth and the decomposition of the crystal occur at the same time. Therefore, the donor impurities once incorporated into the crystal are pushed out at the time of decomposition. When it is attempted to dope the nitride semiconductor with donor impurities at a high concentration, this phenomenon that the donor impurities are pushed out reaches to an unignorable level, and as a result, the crystallinity itself is decreased. Namely, in the case where the nitride semiconductor is doped with the donor impurities at a high concentration, the decrease in the crystallinity is unavoidable under the crystal growth conditions close to the thermal equilibrium state.

By contrast, with the PSD method, the crystal growth advances in a thermal non-equilibrium state. Therefore, the donor impurity is not easily pushed out, and thus the crystallinity is not easily decreased.

In general, the Ge donor tends to be more easily incorporated into the nitride semiconductor crystal at a high concentration than the Si donor. One conceivable reason for this is the following. Since the radius of the Ge ion is close to the radius of Ga ion, the Ge ion easily replaces the Ga ion site. As a result, the accumulation of stress in the nitride semiconductor film is alleviated, and thus the surface of the film tends to be flat.

As described above, the nitride semiconductor according to the present invention realizes a lower specific resistance in a region of a higher electron concentration than the conventional nitride semiconductor.

There are the following documents that disclose inventions relating to a nitride semiconductor device having a low on-resistance.

Japanese Laid-Open Patent Publication No. 2016-115931 (Patent Document 4) discloses an invention relating to a nitride semiconductor device having a low on-resistance. Paragraph 0049 describes that "as described above, the source-side nitride semiconductor regrowth layer 205a and the drain-side nitride semiconductor regrowth layer 206a each may contain n-type impurities at a high concentration. However, as shown in FIG. 4, when the impurity is silicon (Si), even if an impurity amount to be supplied during the growth of a nitride semiconductor layer is increased, the carrier concentration of the impurity in the nitride semiconductor layer to be formed is not increased. That is, the impurity carrier concentration has a certain upper limit. On the other hand, when germanium (Ge) is used as the impurity, a higher carrier concentration than that of silicon can be realized".

Paragraph 0095 describes that "in order to investigate the characteristics of the composite electrode of the nitride semiconductor device 200 thus formed, the sheet resistance of the nitride semiconductor regrowth layer itself and the contact resistance thereof with the 2DEG were measured by a transmission line measurement (TLM) method. FIG. 7 shows the relationship between the sheet resistance of the nitride semiconductor regrowth layer itself and the supply amount of Ge. It was found that when the flow rate ratio of TEGe to TMG is increased to 0.09 or more with an increase in supply amount of TEGe, a nitride semiconductor regrowth layer having a lowered sheet resistance of approximately $1.5 \times 10^{-6}$ $\Omega \cdot cm$ can be obtained. It was found that when a nitride semiconductor regrowth layer formed under the conditions described above is used, the nitride semiconductor device 200 has a contact resistance of 1 to $5 \times 10^{-6}$ $\Omega \cdot cm$, and a preferable contact with the 2DEG can be obtained".

Patent Document 4 and the corresponding United States Patent Application Publication US2016/0172473 (Patent Document 5) filed claiming the benefit of priority to Patent Document 4 were compared against each other regarding the above description. As a result, it has been found out that the name and the unit of the vertical axis of FIG. 7 are variously changed. It is presumed that Patent Document 4 includes some typographical error.

A technological document written by the inventors of Patent Document 4 (IEDM14: Non-patent Document 9), pp. 275-278 ("Extremely low on-resistance Enhancement-mode GaN-based HFET using Ge-doped regrowth technique") will be referred to. This document discloses a Ge-doped nitride semiconductor regrowth layer exhibiting a low on-resistance. FIG. 3 is exactly the same as FIG. 7 of Patent Document 4.

The vertical axis is labeled as "Specific contact resistance $(\Omega \cdot cm^2)$". Regarding FIG. 3, there is a description "the measured specific contact resistance as a function of TEGe supply is shown in FIG. 3, where extremely low specific contact resistance of $1.5 \times 10^{-6}$ $\Omega \cdot cm^2$ was achieved". For this reason, it is considered that the vertical axis of FIG. 7 of Patent Document 4 should be "contact resistance" and the unit should be "$\Omega \cdot cm^2$".

If, as shown in FIG. 7 of Patent Document 4, the specific resistance is about $1.5 \times 10^{-6}$ $\Omega \cdot cm$ and the Ge concentration (electron concentration) is $1 \times 10^{20}$ $cm^{-3}$, the electron mobility is about $42,000$ $cm^2/V \cdot s$. This value is far from the normal value known as the electron mobility of GaN crystal (about $1,200$ $cm^2/V \cdot s$). Based on this also, it is obvious that the above-described portion includes typographical errors.

As described above, Patent Document 4 is considered to disclose a "nitride semiconductor regrowth layer having a lowered contact resistance of approximately $1.5 \times 10^{-6}$ $\Omega \cdot cm^2$".

The above-described nitride semiconductor according to the present invention has a feature of exhibiting a low specific resistance (exhibiting a high mobility) although being in the form of a crystal doped with donors at a high concentration, and utilizing such a feature, is expected to be used for various uses, for example, to decrease the parasitic resistance of an electronic device such as a HEMT or the like, to provide a material replacing a transparent conductive film of ITO or the like, and to realize cascade connection of an LED module. For example, the nitride semiconductor according to the present invention may be applied as follows.

Application to a Vertical Power MOSFET

Figure 19:
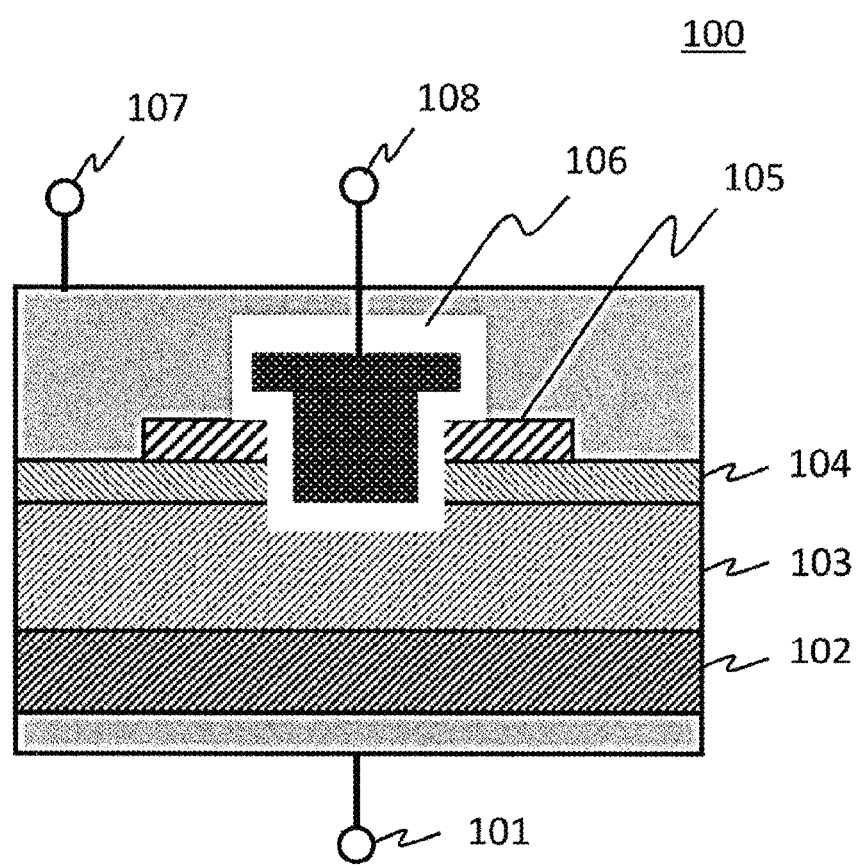
FIG. 19 is a schematic cross-sectional view of a vertical power MOSFET.

FIG. 19 is a schematic cross-sectional view of a vertical power MOSFET. This vertical power MOSFET 100 includes an n⁺-GaN layer 105 of a nitride semiconductor, according to the present invention, formed on a stack structure including an n⁺-GaN layer 102, an n⁻-GaN layer 103 and a p-GaN layer 104. The n⁺-GaN layer 105 according to the present invention may be patterned as follows. After being deposited on the entire surface, the n⁺-GaN layer is patterned by lithography. Alternatively, a selective growth technology may be used, according to which, a crystal surface of gallium nitride is exposed to only a part of a surface of the sample, and the n⁺-GaN layer is epitaxially grown selectively on the exposed part. Reference sign 106 represents an insulating film, reference sign 101 represents a drain, reference sign 107 represents a source, and reference sign 108 represents a gate.

Application to an LED

Figure 20:
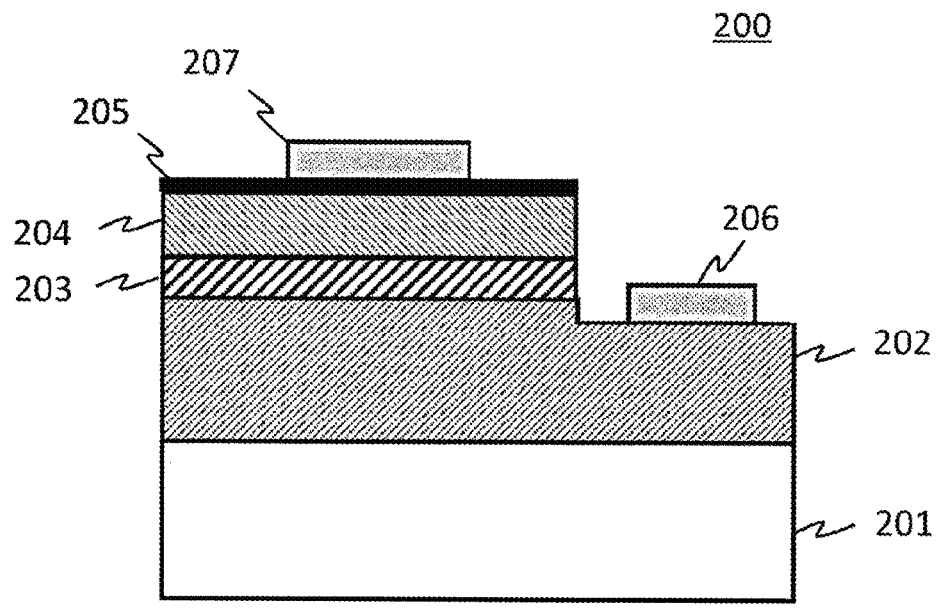
FIG. 20 is a schematic cross-sectional view of a GaN-based LED.

FIG. 20 is a schematic cross-sectional view of a GaN-based LED. The LED 200 includes an n-type nitride semiconductor layer 202, an active layer 203 including a quantum well layer, a p-type nitride semiconductor layer 204, and an n+-GaN layer 205 according to the present invention sequentially stacked on a substrate 201 formed of a nitride semiconductor.

A cathode electrode 206 is formed on a region of the n-type nitride semiconductor layer 202 that is exposed as a result of the n+-GaN layer 205, the p-type nitride semiconductor layer 204 and the active layer 203 being partially removed. An anode electrode 207 is formed above the p-type nitride semiconductor layer 204 with the n+-GaN layer 205 being located therebetween. The n+-GaN layer 205 according to the present invention is conductive with the p-type nitride semiconductor layer 204 via a tunnel junction.

Application to a Schottky Diode

Figure 21:
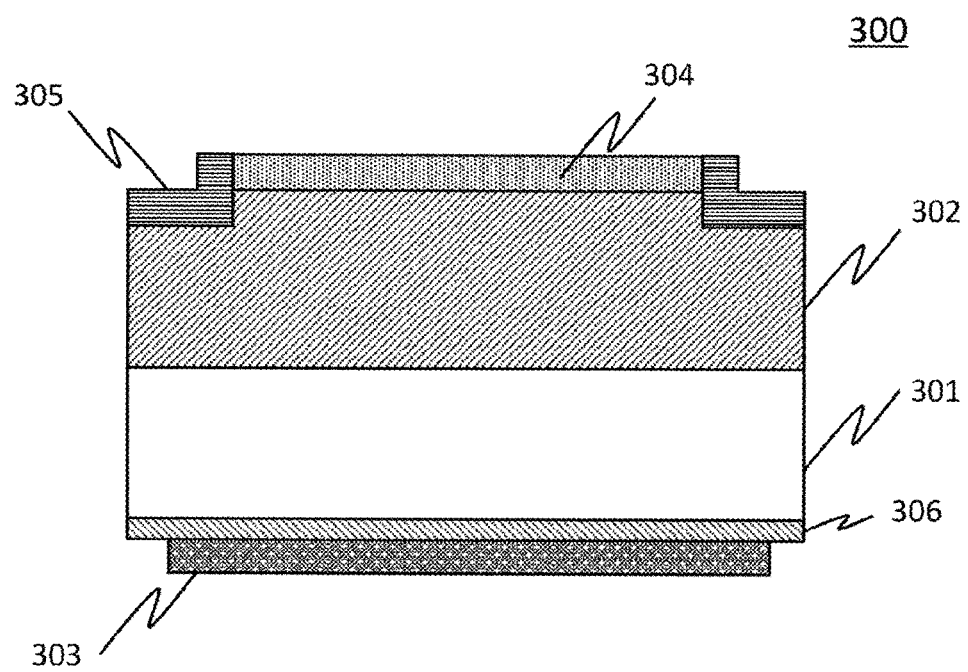
FIG. 21 is a schematic cross-sectional view of a Schottky diode.

FIG. 21 is a schematic cross-sectional view of a Schottky diode. In this Schottky diode 300, an n+-GaN substrate 301 has an n+-GaN layer 306 according to the present invention formed on a rear surface thereof. An n−-GaN layer 302 is formed on a front surface of the n+-GaN substrate 301. An ohmic electrode 303 is formed on the n+-GaN layer 306 side, and a Schottky electrode 304 is formed on the n−-GaN layer 302 side. In the figure, reference sign 305 represents an insulating film.

The nitride semiconductor according to the present invention exhibiting a low specific resistance (exhibiting a high mobility) although being in the form of a crystal doped with a donor at a high concentration is usable for an n+-GaN layer of, for example, an IGBT (Insulated Gate Bipolar Transistor) in addition to the above-described devices.

As described above, the compound semiconductor according to the second invention made by the present inventors may be summarized as follows.

The second invention is directed to a nitride semiconductor having n-type conductivity and containing nitrogen and at least one group 13 element selected from the group consisting of B, Al, Ga and In, in which the nitride semiconductor has an electron concentration of $1 \times 10^{20}$ cm$^{-3}$ or higher and exhibits a specific resistance of $0.3 \times 10^{-3}$ Ω·cm or lower.

Preferably, the electron concentration is $2 \times 10^{20}$ cm$^{-3}$ or higher.

Preferably, the nitride semiconductor has a contact resistance of $1 \times 10^{-4}$ Ω·cm$^2$ or lower against an n-type ohmic electrode metal.

In an embodiment, the nitride semiconductor contains oxygen as an impurity at $1 \times 10^{17}$ cm$^{-3}$ or higher.

Preferably, the nitride semiconductor has an absorption coefficient of 2000 cm$^{-1}$ or lower to light having a wavelength region of 405 nm. Preferably, the nitride semiconductor has an absorption coefficient of 1000 cm$^{-1}$ or lower to light having a wavelength region of 450 nm.

Preferably, the nitride semiconductor has an RMS value of 5.0 nm or less obtained by a surface roughness measurement performed by an AFM.

In an embodiment, the at least one group 13 element is Ga.

In an embodiment, the nitride semiconductor contains either one of, or both of, Si and Ge as donor impurities.

The lower limit of the specific resistance is, for example, $0.2 \times 10^{-3}$ Ω·cm, $0.15 \times 10^{-3}$ Ω·cm, or $0.1 \times 10^{-3}$ Ω·cm.

The relationship between the electron concentration and the specific resistance of the nitride semiconductor fulfills a numerical range enclosed by four points at which (a) the electron concentration is $1 \times 10^{20}$ cm$^{-3}$ and the specific resistance is $0.3 \times 10^{-3}$ Ω·cm, (b) the electron concentration is $3 \times 10^{20}$ cm$^{-3}$ and the specific resistance is $0.3 \times 10^{-3}$ Ω·cm, (c) the electron concentration is $4 \times 10^{20}$ cm$^{-3}$ and the specific resistance is $0.15 \times 10^{-3}$ Ω·cm, and (d) the electron concentration is $9 \times 10^{20}$ cm$^{-3}$ and the specific resistance is $0.15 \times 10^{-3}$ Ω·cm.

The above-described invention is applicable to a contact structure, comprising the nitride semiconductor for a conductive portion. The above-described invention is also applicable to a contact structure, comprising the nitride semiconductor for an electrode. Such a contact structure is usable in a semiconductor device.

INDUSTRIAL APPLICABILITY

The two-, three- or four-component nitride semiconductor according to the present invention exhibits an electron mobility of 46 cm$^2$/V·s or higher even in a region of a high electron concentration of $5 \times 10^{19}$ cm$^{-3}$ or higher.

The present invention is applicable to an important circuit element that determines the performance of an electronic circuit, such as a contact portion of a wiring structure that is included in an electronic device having a low electric resistance and requiring a large amount of electric current, for example, a horizontal power semiconductor device such as an HEMT or the like, a vertical power semiconductor device, a high withstand voltage diode, a thin film transistor, a display device or the like, an active layer or the like.

The nitride semiconductor according to the present invention is usable for a high speed communication device, a computation device, a solar cell, a control circuit, an electronic device for an automobile or the like in addition to the power semiconductor device, the display device and the light emitting device.

REFERENCE SIGNS LIST

1 Sputtering apparatus
2 Take-out roll
3 Take-in roll
4 Substrate film
5 Film formation chamber
10 Continuous film formation apparatus
11 Chamber
12 Substrate electrode
13 Target substrate
14 DC power supply
15 Power supply controller
16 Nitrogen supply source
17 Heating device
12a Heat dissipation sheet
21 Substrate
22 GaN
31 Substrate
32 GaN
33 Insulating layer
34 Insulating layer
35 Contact hole
41 n-type GaN contact layer
42 Ti layer
43 Al layer
44 Ni layer
45 Au layer
100 Vertical power MOSFET
101 Drain
102 n+-GaN layer
103 n−-GaN layer 104 p-GaN layer
105 n⁺-GaN layer
106 Insulating film
107 Source
108 Gate
200 LED
201 Substrate
202 n-type nitride semiconductor layer
203 Active layer
204 p-type nitride semiconductor layer
205 n-side electrode
206 p-side electrode
300 Schottky diode
301 n⁺-GaN layer
302 n⁻-GaN layer
303 Ohmic electrode
304 Schottky electrode
305 Insulating film
306 n⁺-GaN layer

The invention claimed is:

1. A nitride semiconductor having n-type conductivity and containing nitrogen and at least one group 13 element selected from the group consisting of B, Al, Ga and In,
wherein the nitride semiconductor contains either one of Si and Ge as donor impurities and the nitride semiconductor has an electron concentration of $1\times10^{20}$ cm$^{-3}$ or higher and exhibits a specific resistance of $0.3\times10^{-3}$ $\Omega$·cm or lower.

2. The nitride semiconductor according to claim 1, wherein the electron concentration is $2\times10^{20}$ cm$^{-3}$ or higher.

3. The nitride semiconductor according to claim 1, wherein the nitride semiconductor has a contact resistance of $1\times10^{-4}$ $\Omega$·cm$^2$ or lower against an n-type ohmic electrode metal.

4. The nitride semiconductor according to claim 1, wherein the nitride semiconductor contains oxygen as an impurity at $1\times10^{17}$ cm$^{-3}$ or higher.

5. The nitride semiconductor according to claim 4, wherein the nitride semiconductor has an absorption coefficient of 2000 cm$^{-1}$ or lower to light having a wavelength region of 405 nm.

6. The nitride semiconductor according to claim 4, wherein the nitride semiconductor has an absorption coefficient of 1000 cm$^{-1}$ or lower to light having a wavelength region of 450 nm.

7. The nitride semiconductor according to claim 1, wherein the nitride semiconductor has an RMS value of 5.0 nm or less obtained by a surface roughness measurement performed by an AFM.

8. The nitride semiconductor according to claim 1, wherein the at least one group 13 element is Ga.

9. The nitride semiconductor according to claim 1, wherein the specific resistance is $0.2\times10^{-3}$ $\Omega$·cm or higher.

10. The nitride semiconductor according to claim 1, wherein the specific resistance is $0.15\times10^{-3}$ $\Omega$·cm or higher.

11. The nitride semiconductor according to claim 1, wherein the specific resistance is $0.1\times10^{-3}$ $\Omega$·cm or higher.

12. The nitride semiconductor according to claim 1, wherein the nitride semiconductor fulfills a numerical range enclosed by four points at which:
(a) the electron concentration is $1\times10^{20}$ cm$^{-3}$ and the specific resistance is $0.3\times10^{-3}$ $\Omega$·cm,
(b) the electron concentration is $3\times10^{20}$ cm$^{-3}$ and the specific resistance is $0.3\times10^{-3}$ $\Omega$·cm,
(c) the electron concentration is $4\times10^{20}$ cm$^{-3}$ and the specific resistance is $0.15\times10^{-3}$ $\Omega$·cm, and
(d) the electron concentration is $9\times10^{20}$ cm$^{-3}$ and the specific resistance is $0.15\times10^{-3}$ $\Omega$·cm.

13. A contact structure comprising the nitride semiconductor according to claim 1 for a conductive portion.

14. A contact structure comprising the nitride semiconductor according to claim 1 for an electrode.

15. A semiconductor device comprising the contact structure according to claim 13.

16. A semiconductor device comprising the contact structure according to claim 14.

* * * * *